United States Patent
Yin et al.

(10) Patent No.: US 6,471,822 B1
(45) Date of Patent: Oct. 29, 2002

(54) MAGNETICALLY ENHANCED INDUCTIVELY COUPLED PLASMA REACTOR WITH MAGNETICALLY CONFINED PLASMA

(75) Inventors: Gerald Yin, Cupertino, CA (US); Peter Loewenhardt, San Jose, CA (US); Arnold Kholodenko, San Francisco, CA (US); Hong Chin Shan, San Jose, CA (US); Chii Lee, Fremont, CA (US); Dan Katz, Agoura Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/263,001

(22) Filed: Mar. 5, 1999

Related U.S. Application Data

(63) Continuation-in-part of application No. 08/766,119, filed on Dec. 16, 1996, now Pat. No. 6,030,486, which is a continuation of application No. 08/590,998, filed on Jan. 24, 1996.

(51) Int. Cl.$^7$ .................................................. H05H 1/00
(52) U.S. Cl. ...................... 156/345.49; 216/67; 216/68; 118/723 E; 118/723 I; 118/723 IR
(58) Field of Search ...................... 156/345; 118/723 E, 118/723 IR, 723 I; 216/67, 68

(56) References Cited

U.S. PATENT DOCUMENTS

| | | | |
|---|---|---|---|
| 4,716,491 A | 12/1987 | Ohmo et al. | |
| 4,810,935 A | 3/1989 | Boswell | |
| 4,990,229 A | 2/1991 | Campbell et al. | |
| 5,091,049 A | 2/1992 | Campbell et al. | |
| 5,122,251 A | 6/1992 | Campbell et al. | |
| 5,178,739 A | 1/1993 | Barnes et al. | |
| 5,421,891 A | 6/1995 | Campbell et al. | |
| 5,429,070 A | 7/1995 | Campbell et al. | |
| 5,484,485 A | 1/1996 | Chapman | |
| 5,556,501 A | 9/1996 | Collins et al. | |
| 5,662,819 A | 9/1997 | Kadomura | |
| 6,030,486 A | * 2/2000 | Loewenhardt et al. | 156/345 |
| 6,074,518 A | * 6/2000 | Imafuku et al. | 156/345 |
| 6,189,484 B1 | * 2/2001 | Yin et al. | 118/723 I |

FOREIGN PATENT DOCUMENTS

| | | |
|---|---|---|
| JP | A 131374 | 8/1982 |
| JP | A 123022 | 5/1991 |
| JP | A 722389 | 1/1995 |
| JP | A 264515 | 10/1996 |

* cited by examiner

Primary Examiner—Thi Dang
(74) Attorney, Agent, or Firm—Michaelson and Wallace; Joseph Bach

(57) ABSTRACT

The present invention provides a plasma reactor having a plasma source chamber capable of generating a high density plasma typically utilizing a helicon wave. The plasma is delivered to a process chamber having a workpiece. The present invention may provide a plurality of magnets, each being located longitudinally around an axis perpendicular to the plane of the workpiece to form a magnetic bucket that extends the length of the side wall of the processing chamber and across a workpiece insertion opening and a vacuum pump opening. The magnetic bucket of the present invention may be formed so that the pedestal need not be raised to be within the bucket, or may be formed by permanent magnets oriented with one pole of each magnet facing the interior of the processing chamber, or with opposite poles of adjacent magnets facing each other, thereby forming cusps around the axis perpendicular to the plane of the workpiece. Current carrying conductors may generate all or part of the magnetic bucket. The present invention may provide an inner wall member secured within the processing chamber. All or a portion of the inner wall may be grounded to provide a well defined anode for bias power that is applied to the workpiece pedestal, and may be heated so that deposits do not cause its impedance to drift.

50 Claims, 12 Drawing Sheets

MAGNETICALLY ENHANCED INDUCTIVELY COUPLED PLASMA REACTOR WITH MAGNETICALLY CONFINED PLASMA

CROSS REFERENCE

This is a Continuation-in-Part of U.S. patent application Ser. No. 08/766,119, filed Dec. 16, 1996, issued as U.S. Pat. No. 6,030,486, on Feb. 29, 2000, entitled MAGNETICALLY CONFINED PLASMA REACTOR FOR PROCESSING A SEMICONDUCTOR WAFER, which is a Continuation of now abandoned U.S. patent application Ser. No. 08/590,998, filed Jan. 24, 1996, entitled MAGNETICALLY CONFINED PLASMA REACTOR FOR PROCESSING A SEMICONDUCTOR WAFER, herein incorporated by reference in its entirety.

BACKGROUND OF THE INVENTION

1. Field of the Invention

The present invention relates to the field of plasma assisted deposition and etching of a workpiece using a high density plasma source.

2. Description of the Related Art

Plasma reactors, particularly radio frequency (RF) plasma reactors of the type employed in semiconductor wafer plasma processing in the manufacturing of microelectronic integrated circuits, confine a plasma over a semiconductor wafer in the processing chamber by walls defining a processing chamber. Such an approach for plasma confinement has several inherent problems where employed in plasma reactors for processing semiconductor wafers.

First, the walls confining the plasma are subject to attack from ions in the plasma, typically, for example, by ion bombardment. Such attack can consume the material in the walls or introduce incompatible material from the chamber walls into the plasma process carried out on the wafer, thereby contaminating the process. Such incompatible material may be either the material of the chamber wall itself or may be material (e.g., polymer) previously deposited on the chamber walls during plasma processing, which can flake off or be sputtered off. As one example, if the chamber walls are aluminum and the plasma process to be performed is plasma etching of silicon dioxide, then the material of the chamber wall itself, if sputtered into the plasma, is incompatible with the process and can destroy the integrity of the process.

Second, it is necessary to provide certain openings in the chamber walls and, unfortunately, plasma tends to leak or flow from the chamber through these openings. Such leakage can reduce plasma density near the openings, thereby upsetting the plasma process carried out on the wafer. Also, such leakage can permit the plasma to attack surfaces outside of the chamber interior. As one example of an opening through which plasma can leak from the chamber, a wafer slit valve is conventionally provided in the chamber side wall for inserting the wafer into the chamber and withdrawing the wafer from the chamber. The slit valve must be unobstructed to permit efficient wafer ingress and egress. As another example, a pumping annulus is typically provided, the pumping annulus being an annular volume below the wafer pedestal coupled to a vacuum pump for maintaining a desired chamber pressure. The chamber is coupled to the pumping annulus through a gap between the wafer pedestal periphery and the chamber side wall. The flow of plasma into the pumping annulus permits the plasma to attack the interior surfaces or walls of the pumping annulus. This flow must be unobstructed in order for the vacuum pump to efficiently control the chamber pressure, and therefore the pedestal-to-side wall gap must be free of obstructions.

The above problems are intensified in reactors capable of generating high density plasmas such as a Magnetically Enhanced Inductively Coupled Plasma reactor. With the Magnetically Enhanced Inductively Coupled Plasma reactor or MEICP reactor, the plasma is generated by generating a helicon wave in a plasma source chamber located above and in an axial relationship to a substrate processing chamber. The substrate processing chamber typically is surrounded by vertical permanent magnets extending part way down the outside of the processing chamber to form a magnetic bucket for confining the plasma as it enters from the source chamber.

With this type of MEICP reactor, the permanent magnets are oriented so that one pole of each magnet faces the interior of the processing chamber with successive magnets having an opposite polarity facing the chamber. This creates a magnetic field with vertical cusps, which extend part way into the interior of the processing chamber.

It is significant to note that the permanent magnets extend only part way down the sidewall of the processing chamber. A portion of the chamber is located below the magnetic bucket, including the workpiece insertion opening and the pump opening.

With this type reactor, the magnetic bucket is used to provide a uniform plasma in a central zone within the processing chamber. The workpiece is placed on a pedestal below the magnetic bucket and then raised into the magnetic bucket for processing.

This type of plasma reactor also utilizes bias power and cooling apparatus connected via lines to the pedestal. As the pedestal must be moved into the magnetic bucket, the bias power and cooling lines must follow which is not desirable. Also, the pedestal adjustment mechanism itself must be maintained to ensure proper functionality.

As discussed above, a problem inherent to plasma reactors, including MEICP reactores, is degradation of reactor components exposed to the plasma. The surface of the walls confining the plasma are subject to attack from ions in the plasma. Such attack can consume the material causing periodic maintenance and reactor down time. In addition, the chamber wall may introduce an incompatible material into the plasma. For example, if a silicon dioxide etch is being performed and the chamber walls are aluminum, the aluminum may sputter into the plasma and deposit on the workpiece, thereby contaminating the workpiece. Likewise, any by-products deposited on the chamber walls may also sputter or flake off and contaminate the workpiece.

In addition to the surface of the walls, any openings, such as the opening for workpiece placement on the pedestal or the vacuum pump opening are also subject to degradation. Such degradation may prevent those openings from functioning properly. For example, the workpiece opening which is normally sealed during processing may not seal properly due to degradation and as a result, allow air to leak in thereby reducing plasma density and upsetting workpiece processing. Or, by-products may deposit in or around the opening prohibiting insertion of the workpiece. Likewise, the pumping opening may become obstructed thereby affecting pumping efficiency.

Another problem with this type reactor is that the magnetic bucket protects the sidewalls but not the top wall. The top wall or ceiling, therefore, may be exposed to plasma and other process gases. Because the plasma near the ceiling has very high density as it exits the plasma source chamber, the exposed ceiling experiences a greater degree of degradation by the plasma.

Furthermore, because the ceiling is unprotected, build-up is more likely to occur. Build-up on the ceiling can change processing parameters and degrade processing. For example, to control ion energy at the workpiece, an RF bias may be applied to the workpiece, with the walls of the processing chamber serving as the anode and being grounded. In such a case, the coupling of bias power to the workpiece affects the ion energy. Any decrease in the bias power will reduce ion energy. Changes in bias power can occur, for example, when polymer is used during oxide etch to control etch selectivity. Polymer builds up on the anode and thereby changes its impedance. Polymer build-up on the anode, therefore, will cause ion energy to drift, thereby reducing ion energy at the workpiece.

Changes in ion energy will affect processing parameters. Changes in ion energy due to polymer build-up could be compensated for by increasing bias power during processing if the changes were predictable. Increasing bias power during processing, however, would further complicate processing and introduce uncertainties to processing.

Furthermore, the problem is exaggerated after several workpieces have been processed and more build-up is added to the anode. Cleaning of the chamber after processing each workpiece is possible but not desirable because it would lower throughput and increase costs.

In certain ion driven processes, such as oxide etch, ion energy is critical. Changes in ion energy during processing results in different and often unacceptable etch characteristics. For example, polymer build-up during an etch process could lead to etch stopping. Therefore, the build-up of polymer during ion etch is particularly problematic.

BRIEF SUMMARY OF THE INVENTION

The present invention provides a plasma reactor having a plasma source chamber capable of generating a high density plasma. Typically, a magnetically enhanced inductively coupled source power applicator capable of generating a helicon wave is used to generate the plasma. The plasma source chamber is coupled to a processing chamber to allow the plasma to flow into the processing chamber, which has a pedestal for supporting a workpiece.

The plasma reactor of the present invention improves workpiece processing. Using a helicon wave to generate the plasma allows a uniform high density plasma to be generated in the plasma source chamber over a large range of temperatures and pressures. This allows the present invention to be employed over a large process window for both etching and deposition processes.

The plasma chamber source power applicator is typically a double loop antenna disposed around a bell chamber which is provided with current by an RF source generator so as to create a helicon wave. Although any type helicon wave may be used, an m=0 helicon wave is presently preferred. The plasma chamber power applicator may also include nested electromagnets which provide an axial magnetic field within the plasma chamber. The interaction between the axial magnetic field and the induced RF electric field within the bell chamber gives rise to the helicon wave and assists in directing its flow toward the processing chamber.

An advantage of higher density plasma is that plasma generation may be moved farther from the workpiece while still maintaining sufficient plasma density to process the workpiece. An advantage of moving plasma generation farther from the workpiece is that it allows the plasma to "cool" before it reaches the workpiece. Allowing ions, particularly electrons, to "cool" before impacting the workpiece reduces uneven charge build-up and resulting damage. Furthermore, the more uniform plasma prevents plasma nulls which are typical of conventional inductively coupled reactors and which cause uneven workpiece processing.

With conventional inductively coupled plasma reactors, the source power-to-workpiece gap is much smaller than is allowed by magnetically enhanced reactors. A larger gap would cause the power density drops which would unacceptably lower the etch rate. The magnetically enhanced inductively coupled source power applicator, on the other hand, provides more efficient coupling of source power to the process gases, and so it is able to provide nearly 100% ionization in the plasma. This allows the gap to be increased while maintaining sufficient plasma density for processing.

This also allows lower operating pressures which provides a larger plasma operating window. The source power applicator of the present invention, therefore, allows the present invention to be run at lower pressures. As higher pressure narrows the process window by causing faster recombination of plasma particles, lower operating pressure expands the operating window. The magnetically enhanced source power applicator of the present invention allows the present invention to be operated over a wide range of RF source power, magnetic field strength, and pressures, thereby expanding the processing window.

While high density plasma generally improves processing, it may also increase reactor component degradation. Components such as the workpiece insertion opening and associated mechanisms, the vacuum pump opening and associated mechanisms, and the processing chamber walls, among other components, are susceptible to damage by the plasma. To prevent plasma from flowing into the workpiece insertion opening, one embodiment of the present invention provides a magnetic field across a workpiece insertion opening of sufficient magnetic strength to inhibit plasma from advancing into the workpiece insertion opening from the processing chamber. This may be accomplished by employing a pair of magnets on either side of the opening. The magnets may have poles facing an axis perpendicular to the plane of the workpiece, or facing parallel to the axis, and may form an open magnetic circuit or a closed magnetic circuit.

As the workpiece insertion opening typically is horizontally located in the chamber wall, horizontal magnets may be located above and below the opening to provide the magnetic field across the opening. The horizontal magnets may annular and disposed around an axis perpendicular to the plane of the workpiece. Additional magnets may be provided above those located adjacent the workpiece insertion opening so as to create a cusped magnetic field that extends along the side wall of the processing chamber to form a magnetic bucket.

Another embodiment of the present invention provides a magnetic field across the vacuum pump opening of sufficient magnetic strength to inhibit plasma from advancing into the vacuum pump opening from the processing chamber. This may be accomplished by employing a pair of magnets on either side of the vacuum pump opening. The magnets may have poles facing an axis perpendicular to the plane of the workpiece, or facing parallel to it, and may form an open magnetic circuit or a closed magnetic circuit.

In one embodiment, the vacuum pump opening is an annular opening located in the bottom wall of the processing chamber adjacent the side wall. With this embodiment, annular magnets are located on either side of the vacuum pump opening and may form a closed magnetic circuit, or an open magnetic circuit. Additional magnets may be added above one of the magnets, which may be located in, or adjacent the side wall, so as to create the cusped magnetic field that extends along the side wall of the processing chamber to form the magnetic bucket.

In another embodiment, the vacuum pump opening is located in the side wall of the processing chamber. In this embodiment, a portion of the vacuum pump opening may form the workpiece insertion opening. Magnets are located above and below the vacuum pump opening so as to inhibit plasma from entering the vacuum pump opening. With this embodiment, the pole axis of the magnets may face toward the interior of the processing chamber, or may face parallel to the walls of the processing chamber in an open magnetic circuit configuration. Additional magnets may be added above the upper magnet, so as to create the cusped magnetic field extending along the side wall of the processing chamber forming the magnetic bucket.

In yet another embodiment, the present invention provides a plurality of magnets disposed around an axis perpendicular to the plane of the workpiece, which form a magnetic bucket that extends the length of the side wall of the processing chamber. One advantage is that the pedestal need not be raised to be within the bucket. The magnetic bucket confines the plasma to improve plasma density over the workpiece and also confines the plasma away from reactor components, such as the lower portion of the processing chamber side wall. As discussed above, it may also confine plasma away from the workpiece insertion opening and the vacuum pump opening, among other components. In such a case, the present invention inhibits plasma from flowing into the workpiece insertion opening and the vacuum pump opening when a portion of the vacuum pump opening forms the workpiece insertion opening, or when the vacuum pump opening and the workpiece insertion opening are separate openings.

The magnetic bucket may be formed by permanent magnets oriented so that one pole of each of the plurality of magnets faces the interior of the processing chamber with adjacent magnets having opposite poles facing the interior of the processing chamber thereby forming cusps disposed longitudinally around an axis perpendicular to the plane of the workpiece. Or, the magnetic bucket may be formed by permanent magnets oriented so that the faces of the poles of each of the plurality of magnets face parallel with the interior of the processing chamber, with adjacent magnets having opposite poles facing each other thereby forming cusps disposed longitudinally around an axis perpendicular to the plane of the workpiece of the processing chamber. The present invention may employ open circuit magnets, closed circuit magnets, or a combination of the open and closed circuit magnets to confine the plasma away from the reactor components and to inhibit plasma from entering the vacuum pump and workpiece insertion openings. Furthermore, the magnetic bucket of the present invention may be formed by passing current through conductors located around the central axis of the processing chamber, or by a combination of conductors and permanent magnets.

Other embodiments of the present invention provide protection to reactor components and also provide precise control of the ion energy of the plasma generated by the present invention. One embodiment of the present invention provides an inner wall member. The inner wall member may be removably secured within the processing chamber so as to form an interior wall surface exposed to the plasma. The inner wall, therefore, may be easily replaced after being degraded by the plasma.

In a further embodiment, the present invention may provide the inner wall member as a controlled counterelectrode to improve workpiece processing. The voltage potential of all, or a portion of, the inner wall member may be controlled to provide a well defined anode for bias power that is applied to the workpiece pedestal for controlling ion energy. Typically, the inner wall member is grounded and insulated from the rest of the processing chamber. To further improve processing, the inner wall member may be temperature controlled so that process by-products, or process gases, do not condense on the inner wall and cause its impedance to drift.

The inner wall member of the above embodiments may be annular and attached to the top wall of the chamber. Additionally, it may have a cylindrical portion depending down so that the inner wall member may provide an anode to cathode ratio greater than, or equal to, about 3:1 to better control ion energy control so as to increase etch rate while not incurring additional charge damage.

The improved plasma reactor of the present invention may include all, or only some of the features of the above embodiments.

DETAILED DESCRIPTION OF THE PRESENT INVENTION

Conventional Reactor Elements

Figure 1:
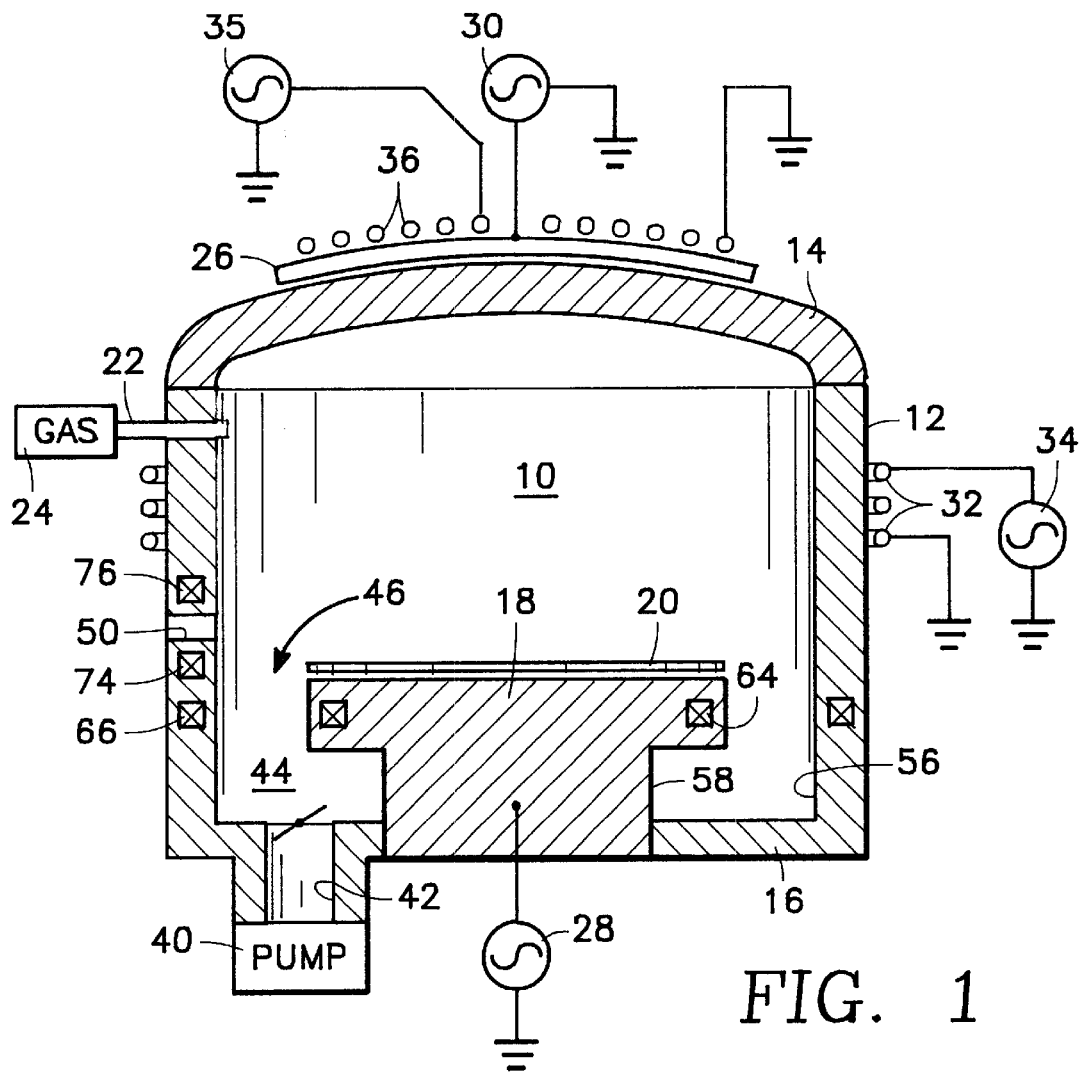
FIG. 1 is a cut-away side view of a plasma reactor in accordance with a first embodiment of the invention employing open magnetic circuits.

Referring to FIG. 1, an RF plasma reactor for processing a semiconductor wafer has a vacuum chamber 10 enclosed by a cylindrical side wall 12, a ceiling 14 and a floor 16. A wafer pedestal 18 supports a semiconductor wafer 20 which is to be processed. A plasma precursor gas is injected into the chamber 10 through a gas injector or inlet 22 from a gas supply 24. Plasma source power is coupled into the chamber 10 in any one of several ways. For example, the reactor may be a "diode" configuration, in which case RF power is applied across a ceiling electrode 26 and the wafer pedestal 18. This is accomplished by connecting the pedestal 18 and the ceiling electrode 26 to either one of two RF power sources 28, 30. Alternatively, a cylindrical side coil 32 wound around the chamber side wall 12 is connected to an RF power source 34. Alternatively to the foregoing, or in addition thereto, a top coil 36 is connected to an RF power supply. Although not shown in FIG. 1, in the invention described below, a plasma source chamber having a source power applicator capable of generating a helicon wave may produce plasma in a plasma source chamber for delivery to a processing chamber having a workpiece as shown in FIGS. 9–16.

As is conventional, the wafer pedestal 18 may have its own independently controllable RF power supply 28 so that ion bombardment energy at the wafer surface can be controlled independently of plasma density, determined by the RF power applied to the coil 32 or the coil 36.

A vacuum pump 40 is coupled to the chamber 10 through a passage 42 in the floor 16. The annular space between the periphery of the wafer pedestal 18 and the floor 16 forms a pumping annulus 44 through which the vacuum pump 40 evacuates gas from the chamber 10 to maintain a desired processing pressure in the chamber 10. The pumping annulus 44 is coupled to the interior of the chamber 10 through an annular gap or opening 46 between the periphery of the wafer pedestal 18 and the chamber side wall 14. In order for the pump 40 to perform efficiently, the gap 46 is preferably free of obstructions.

A conventional slit valve opening 50 of the type well-known in the art having a long thin opening in the chamber side wall 14 provides ingress and egress for a semiconductor wafer 20 to be placed upon and withdrawn from the wafer pedestal 18.

The walls 12, 14 confining the plasma within the chamber 10 are subject to attack from plasma ions and charged radicals, typically, for example, by ion bombardment. Such attack can consume the material in the walls 12, 14 or introduce incompatible material from the chamber walls 12, 14 into the plasma process carried out on the wafer 20, thereby contaminating the process. Such incompatible material may be either the material of the chamber wall itself or may be material (e.g., polymer) previously deposited on the chamber walls during plasma processing, which can flake off or be sputtered off. Plasma reaching the chamber walls can cause polymer deposition thereon.

The openings from the interior portion of the chamber 10, including the pedestal-to-side wall gap 46 and the slit valve opening 50, permit the plasma to leak or flow from the chamber 10. Such leakage can reduce plasma density near the openings 46, 50, thereby upsetting the plasma process carried out on the wafer 20. Also, such leakage can permit the plasma to attack surfaces outside of the chamber interior. The flow of plasma into the pumping annulus 44 through the gap 46 permits the plasma to attack the interior surfaces or walls of the pumping annulus 44. Thus, the designer must typically take into account not only the materials forming the chamber ceiling 12 and side wall 14, but in addition must also take into account the materials forming the pumping annulus, including the lower portion 56 of the side wall 14, the floor 16 and the bottom peripheral surface 58 of the wafer pedestal 18, which complicates the design. Such a loss of plasma from the chamber 10 also reduces plasma density or requires more plasma source power to maintain a desired plasma density over the wafer 20.

Magnetic Confinement in the Present Invention

In order to prevent plasma from flowing from the chamber 10 into the pumping annulus, a magnetic field perpendicular to the plane of the gap 46 and perpendicular to the direction of gas flow through the gap 46 is provided across the gap 46. This is preferably accomplished by providing an opposing pair of magnetic poles 60, 62 juxtaposed in facing relationship across the gap 46. In the embodiment according to FIG. 2, the magnetic pole 60 is the north pole of a magnet 64 located at the periphery of the wafer pedestal 18 while the magnetic pole 62 is the south pole of a magnet 66 next to the inner surface of the side wall 14. The embodiment of FIG. 2 may be regarded as an open magnetic circuit because the returning magnetic field lines of flux 68 in FIG. 2 radiate outwardly as shown in the drawing.

In order to prevent plasma from flowing from the chamber 10 through the slit valve opening 50, a magnetic field perpendicular to the plane of the slit valve opening 50 and perpendicular to the direction of gas flow through the slit valve opening 50 is provided across the slit valve opening 50. This is preferably accomplished by providing an opposing pair of magnetic poles 70, 72 juxtaposed in facing relationship across the slit valve opening 50. In the embodiment according to FIG. 3, the magnetic pole 70 is the north pole of a magnet 74 extending across the bottom edge of the slit valve opening 50 while the magnetic pole 72 is the south pole of a magnet 76 extending along the top edge of the slit valve opening 50. The embodiment of FIG. 3 may also be regarded as an open magnetic circuit because the returning magnetic field lines of flux 78 in FIG. 3 radiate outwardly as shown in the drawing.

One potential problem with the returning lines of magnetic flux 68 (FIG. 2) and 78 (FIG. 3) is that some returning flux lines extend near the wafer 20 and may therefore distort or perturb plasma processing of the wafer 20. In order to minimize or eliminate such a problem, a closed magnetic circuit (one in which returning magnetic lines of flux do not extend into the chamber) is employed to provide the opposing magnetic pole pairs 60, 62 and 70, 72. For example, in the embodiment of FIGS. 4 and 5, the opposing magnetic poles 60, 62 across the gap 44 are each a pole of a respective horseshoe ring magnet 80, 82 concentric with the wafer pedestal 18. The horseshoe ring magnet 80 has the north pole 60 and a south pole 81 while the horseshoe ring magnet has the south pole 62 and a north pole 83. The poles 60, 81 of the inner horseshoe ring magnet 80 are annuli connected at their inner radii by a magnetic cylindrical core annulus 85. Similarly, the poles 62, 83 of the outer horseshoe ring magnet 82 are annuli connected at their outer radii by a magnetic cylindrical core annulus 86. The magnetic circuit consisting of the inner and outer horseshoe ring magnets 80, 82 is a closed circuit because the lines of magnetic flux between the opposing pole pairs 60, 62 and 81, 83 extend straight between the poles and, generally, do not curve outwardly, at least not to the extent of the outwardly curving returning lines of flux 68, 78 of FIGS. 2 and 3.

Figure 4A:
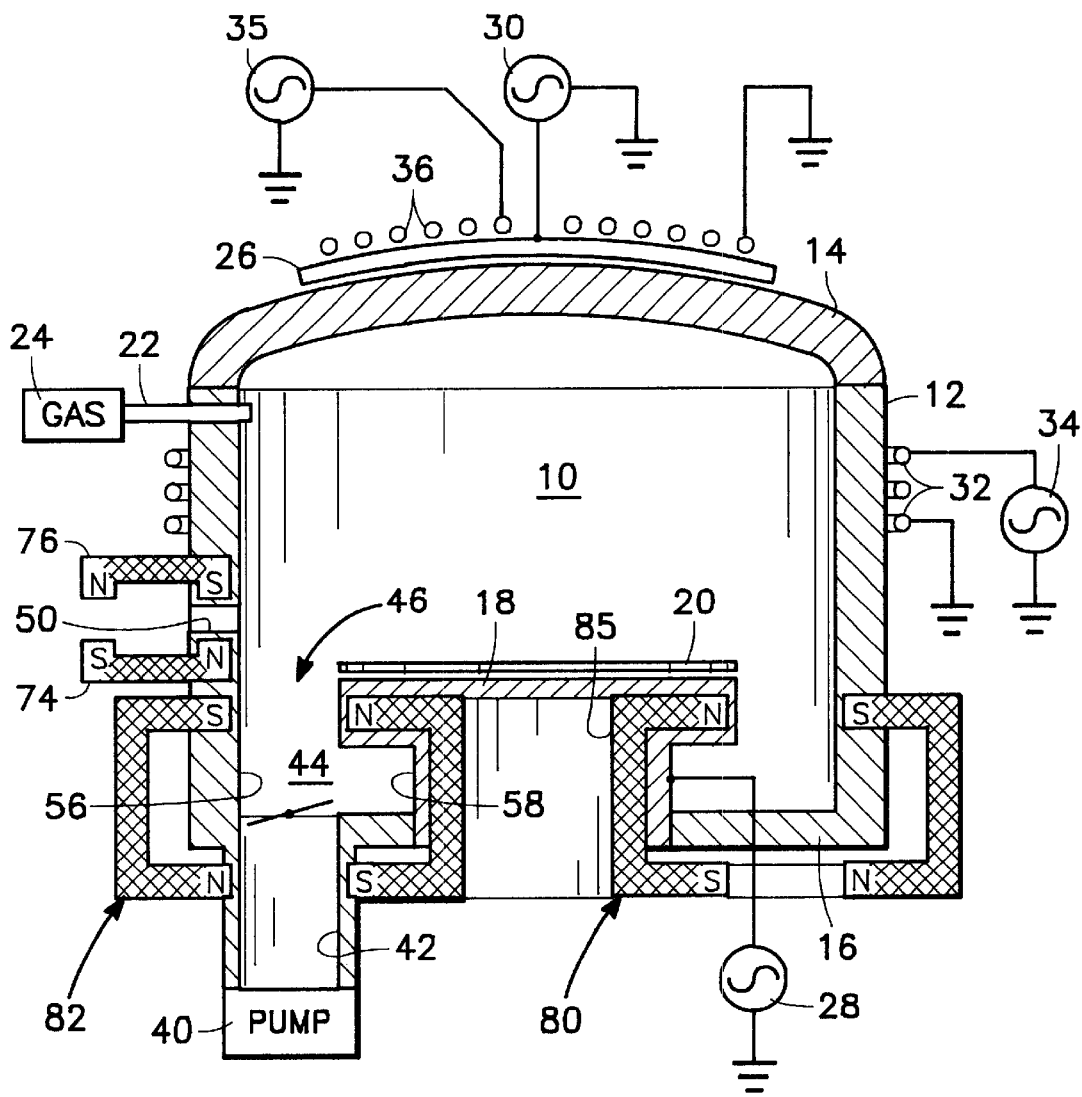
FIGS. 4A and 4B correspond to a side view of a plasma reactor in accordance with a preferred embodiment of the invention employing closed magnetic circuits having pairs of opposed magnets.
Figure 4B:
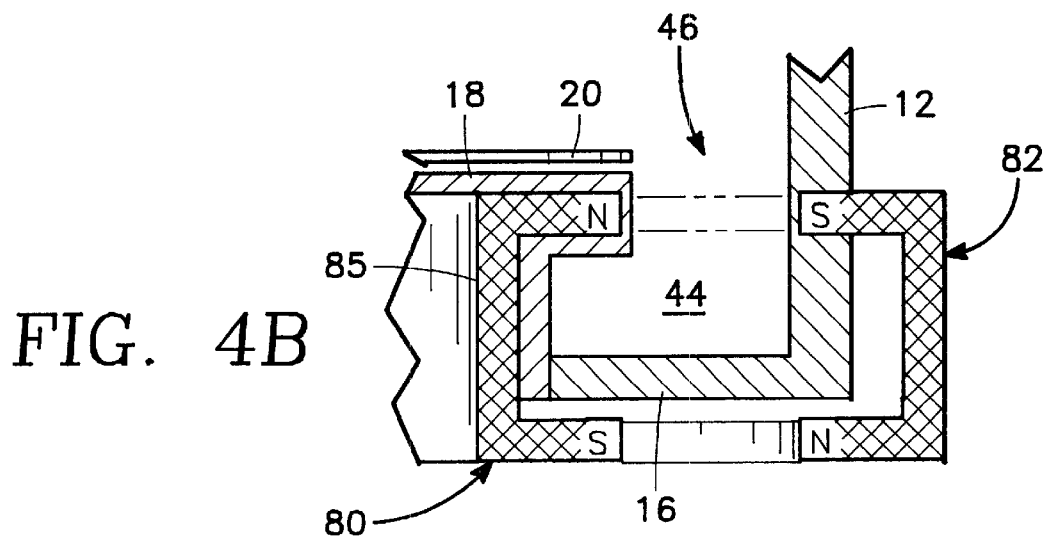
Figure 6:
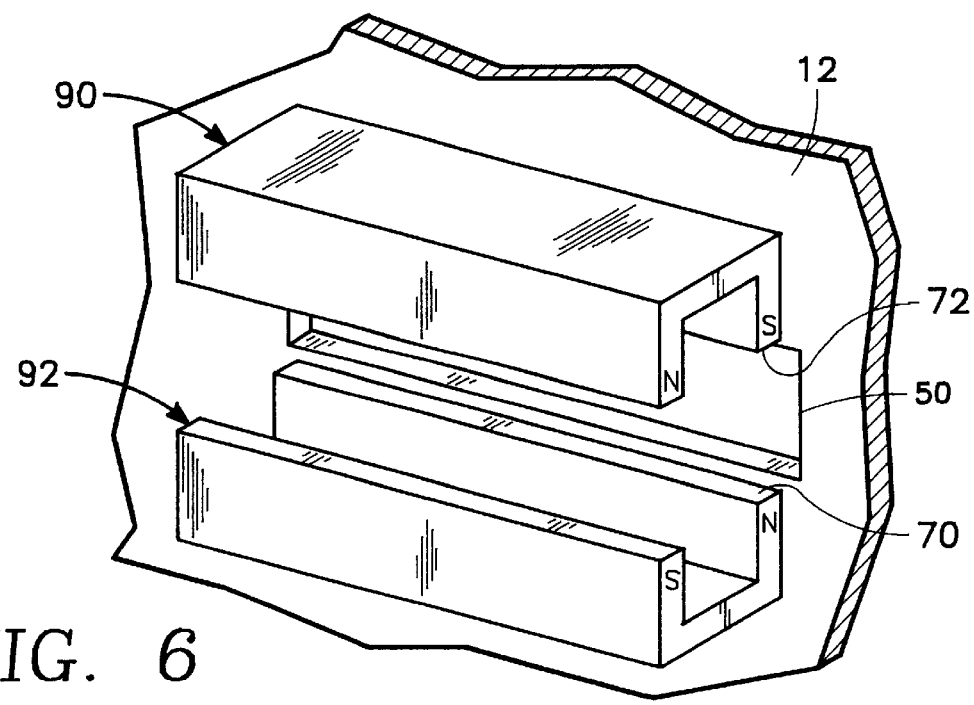
FIG. 6 is a perspective view of a pair of opposing magnets juxtaposed across the wafer slit valve.

In the embodiment of FIGS. 4A, 4B and 6, the opposing magnetic poles 70, 72 across the slit valve opening 50 are each a pole of a respective long horseshoe magnet 90, 92 extending along the length of the slit valve opening 50. The long horseshoe magnet 90 extends along the top boundary of the slit valve opening 50 while the other horseshoe magnet extends along bottom edge of the slit valve opening 50.

The advantage of the closed magnetic circuit embodiment of FIG. 4 is that the magnetic field confining the plasma does not tend to interfere with plasma processing on the wafer surface.

Figure 7:
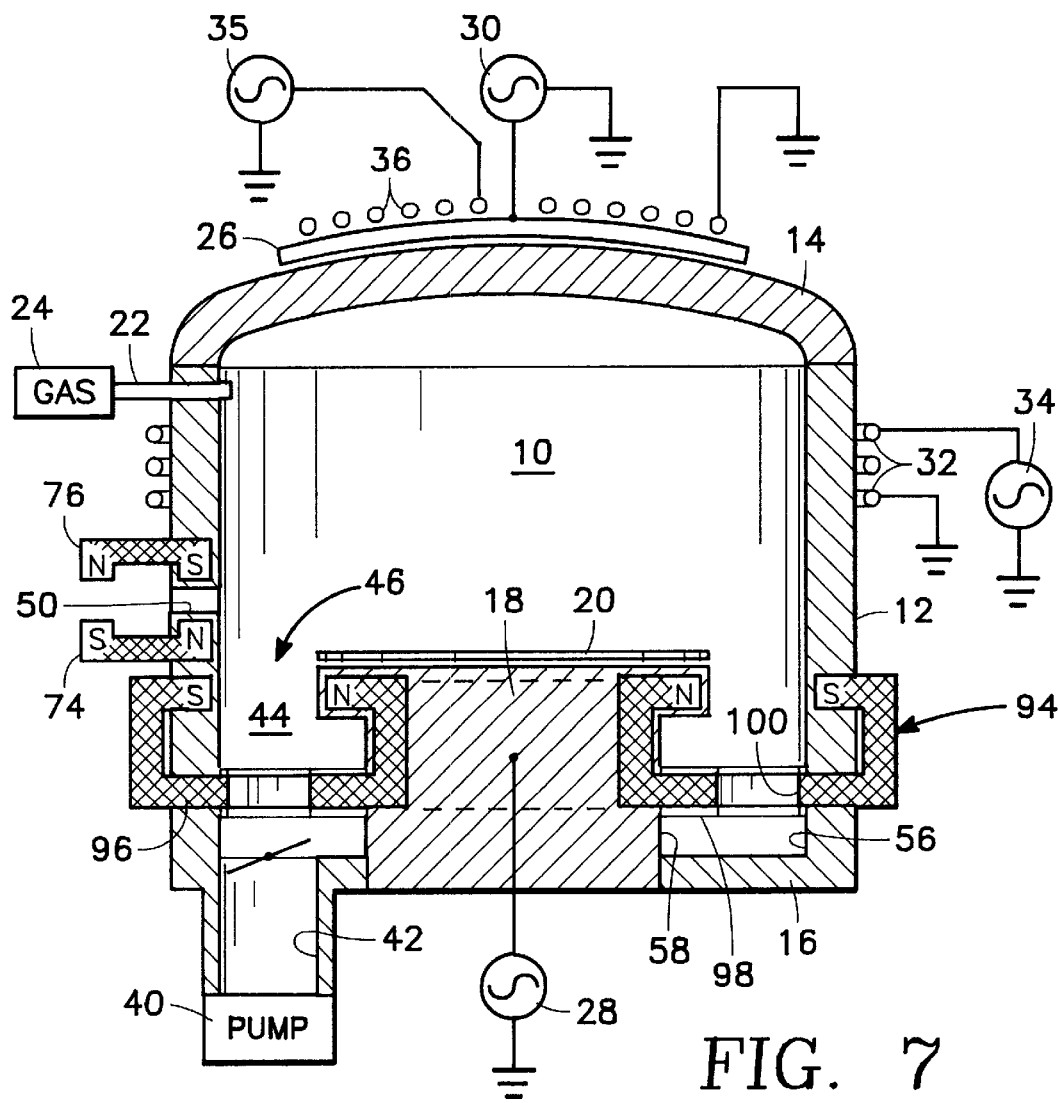
FIG. 7 is a cut-away side view of a plasma reactor in which the closed magnetic circuit is a single magnet whose opposing poles are juxtaposed across the pedestal-to-side wall gap and which are joined by a core extending across the pumping annulus.
Figure 8:
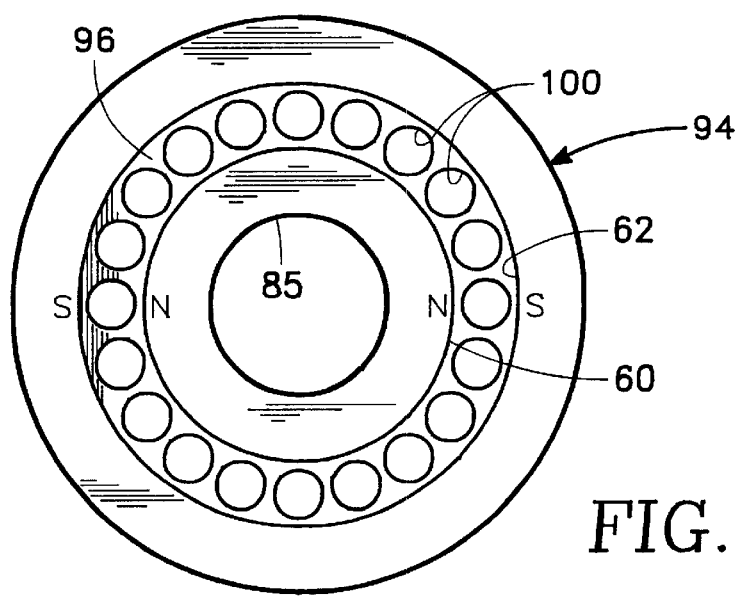
FIG. 8 is a top view of the single magnet of FIG. 7 and showing the gas flow holes through the core joining the opposite poles of the magnet.

In the embodiment of FIGS. 7 and 8, the lower annuli 81, 83 of the two horseshoe ring magnets 80, 82 are joined together as a single annulus by a magnetic core annulus 96, so that the horseshoe ring magnets 80, 82 constitute a single horseshoe ring magnet 94 having a north pole 60 and a south pole 62. The core annulus 96 extends across the pumping annulus 44 and can be protected by a protective coating 98 such as silicon nitride. In order to allow gas to pass through the pumping annulus 44, the core annulus 96 has plural holes 100 extending therethrough.

One advantage of the invention is that plasma ions are excluded from the pumping annulus 44. This is advantageous because the pumping annulus interior surfaces can be formed of any convenient material without regard to its susceptibility to attack by plasma ions or compatibility of its sputter by-products with the plasma process carried out on the wafer. This also eliminates reduction in plasma density due to loss of plasma ions through the pumping annulus. Another advantage is that gas flow through the pedestal-to-side wall gap 46 is not obstructed even though plasma is confined to the interior chamber 10 over the wafer. Furthermore, by so confining the plasma to a smaller volume (i.e., in the portion of the chamber 10 directly overlying the wafer 20), the plasma density over the wafer 20 is enhanced. A further advantage is that stopping plasma ions from exiting through the slit valve opening 50 eliminates loss of plasma density over portions of the wafer 20 adjacent the slit valve opening 50.

In one example, each of the magnetic pole pair 60, 62 has a strength of 20 Gauss for a distance across the gap 46 of 5 cm, while each of the magnetic pole pair 70, 72 has a strength of 20 Gauss for a width of the slit valve opening 50 of 2 cm.

While the invention has been described with reference to preferred embodiments in which the plasma confining magnets are protected from attack from plasma ions and processing gases by being at least partially encapsulated in the chamber walls or within the wafer pedestal or within a protective layer, in some embodiments (as for example, the embodiment of FIG. 6) the magnets may be protected by being located entirely outside of the chamber walls. Alternatively, if some plasma interaction with the magnets is tolerable, magnets may be located inside the chamber in direct contact with the plasma, although this would not be preferred.

The reactor chambers of FIGS. 1, 4A, and 7 may employ a magnetically enhanced inductively source power applicator to generate the plasma. In such a case, the top wall of FIGS. 1, 4A, or 7 may be fitted with an additional chamber for generating plasma. With such a reactor, the magnetic pole arrangement may be continued along the chamber wall to provide additional plasma confinement and additional protection for the chamber walls.

Figure 9:
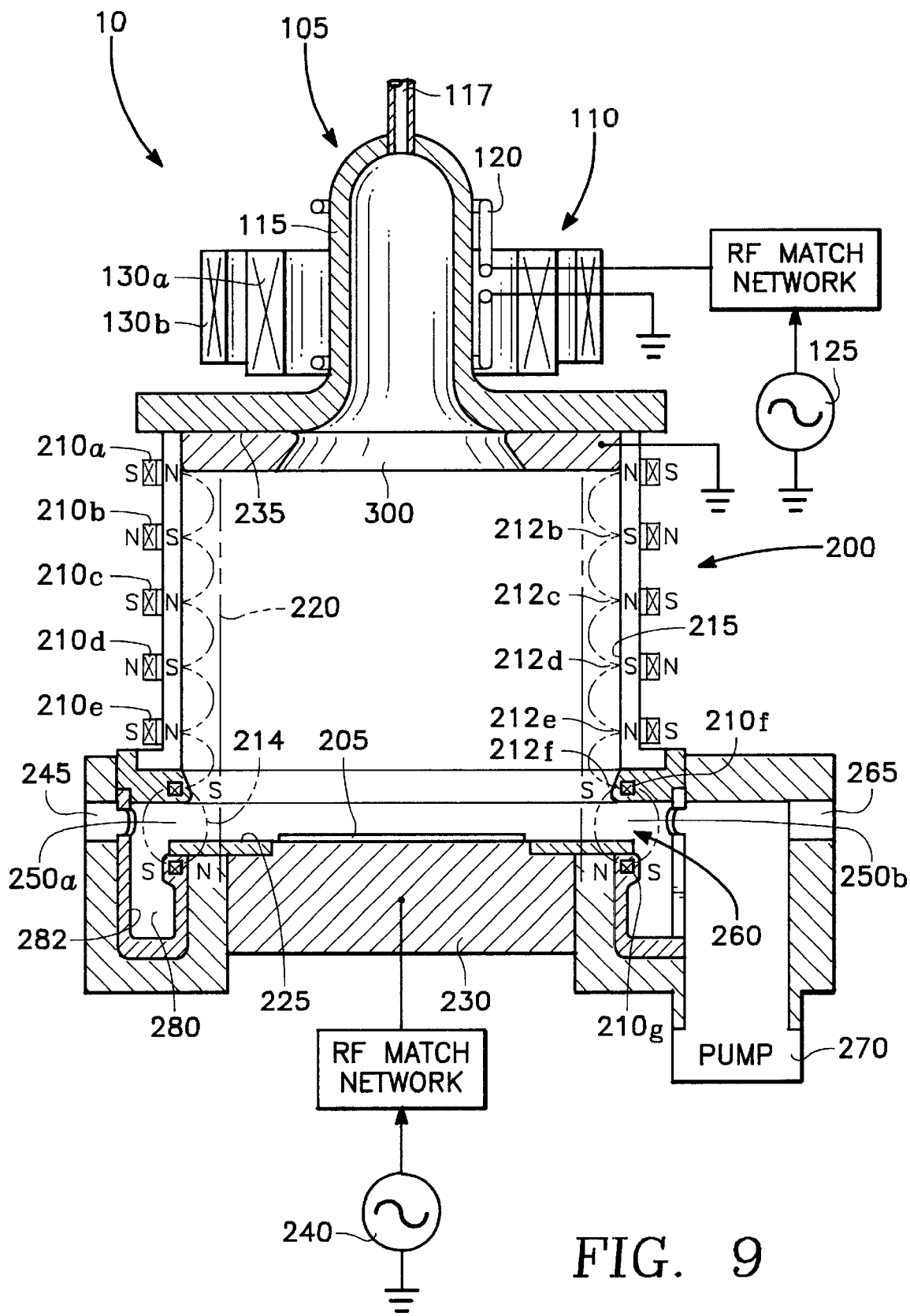
FIG. 9 is a cross-sectional view of a Magnetically Enhanced Inductively Coupled plasma reactor of the present invention.

Magnetic Confinement in a Magnetically Enhanced Inductively Coupled Plasma Reactor FIG. 9 illustrates a presently preferred embodiment of the plasma reactor 10 of the present invention used to improve plasma etching and deposition. A plasma source chamber 105 is coupled to a processing chamber 200 which is adapted to hold a workpiece 205 therein. Plasma is generated in the plasma source chamber 105 from process gas and delivered to the processing chamber for processing the workpiece 205. The process gas may be introduced into the plasma source chamber through a gas inlet 117.

FIG. 9 illustrates the plasma source chamber 105 having a source power applicator 110 capable of generating a helicon wave to generate plasma. Using a helicon wave to generate the plasma allows a uniform high density plasma to be generated in the plasma source chamber 105 over a large range of temperatures and pressures. This allows the present invention to be employed over a large process window for both etching and deposition processes.

Some attributes and examples of helicon wave plasma generation devices are disclosed in U.S. Pat. Nos. 4,990,229 and 5,421,891 and 5,429,070, all by Campbell et al., all entitled HIGH DENSITY PLASMA DEPOSITION AND ETCHING APPARATUS, issued Feb. 5, 1991 and Jun. 6, 1995 and Jul. 4, 1995 respectively, all herein incorporated by reference in their entirety.

In the preferred embodiment, the plasma chamber source power applicator 110 is typically a double loop antenna 120 disposed around the cylinder of a bell chamber 115 and provided with current by an RF source generator 125 so that the current in one loop passes in a clockwise manner while the current in the other loop passes in a counterclockwise manner to produce currents 180 degrees out of phase so as to create an m=0 helicon wave within the bell chamber 115. The bell chamber 115 may be made of quartz and have a diameter of 10 cm with the optimum distance between loops being such that the time taken for the induced helicon wave to propagate between the two loops is ½ of the RF period (about 12.5 cm for 13.56 MHZ). It is also possible to use a single loop antenna to induce an m=0 helicon wave.

In this embodiment, the plasma chamber power applicator also includes nested electromagnets 130a & 130b which provide an axial magnetic field within the plasma chamber 105. The interaction between the axial magnetic field and the induced RF electric field within the cylinder 115 gives rise to the helicon wave which forms the plasma in the plasma source chamber 105. The current in the inner and outer magnets 130a & 130b, may be adjusted to provide a magnetic field which diverges rapidly outside the plasma chamber cylinder 115. The axial magnetic field in the plasma chamber 105, typically in the range of 30 to 300 Gauss, directs the plasma to the processing chamber 200 where it diverges into the processing chamber 200. This divergence assists in providing plasma uniformity within the processing chamber and also serves to keep the magnetic field away from the workpiece 205.

The plasma chamber 105 is not limited to the above described layout to produce an m=0 helicon wave. Also, other antenna configurations may be employed to generate other modes of helicon waves, such as m=1, to form the plasma. The above-mentioned patents, incorporated by reference, provide examples of helicon wave plasma generation devices that may be employed by the present invention.

The processing chamber 200 is adapted to support a workpiece 205. The workpiece 205 is supported by pedestal 230. In the preferred embodiment, RF bias power applicator 240 supplies bias power to the workpiece 205 via the pedestal 230. The bias power is used to control ion energy at the workpiece 205. In the embodiment of FIG. 9, the pedestal 230 forms part of a bottom wall 225 of the processing chamber 200 and typically is located about 10 to 20 cm from the plasma chamber-to-processing chamber coupling. Although the processing chamber 200 illustrated in FIG. 9 is cylindrical in shape with a flat annular top wall 235, the processing chamber of the present invention may have any other configuration. For example, the chamber may have polygonal walls, the top wall may be dome-shaped, or any other configuration known in the art may be employed to form the processing chamber of the present invention.

An advantage of the source power applicator of the present invention is that can generate a high density plasma. This allows plasma generation to be moved to farther from the workpiece while still maintaining sufficient plasma density to process the workpiece. An advantage of moving plasma generation farther from the workpiece is that it allows the plasma to "cool" before it reaches the workpiece. Allowing ions, particularly electrons, to "cool" before impacting the workpiece reduces uneven charge build-up. Otherwise, charge induced device damage may result from uneven charge build-up thereby damaging the photoresist layer or the workpiece itself. It also provides lower and more uniform electron temperature leading to less electron shading effects.

Conventional inductively coupled plasma reactors have a much smaller source power-to-workpiece gap. Typically, the gap is around 7 cm. If this gap is much larger, the power density drops which unacceptably lowers the etch rate. The magnetically enhanced inductively couple source power applicator, on the other hand, provides more efficient coupling of source power to the process gases so is able to provide nearly 100% ionization in the plasma. This allows the gap to be increased while maintaining sufficient plasma density for processing.

This also allows lower operating pressures which provides a larger plasma operating window. The source power applicator of the present invention allows the present invention to be run at lower pressures, such as 1 mT. As higher pressure narrows the process window by causing faster recombination of plasma particles, lower operating pressure thereby expands the operating window. The magnetically enhanced source power applicator of the present invention allows the present invention to be operated over a wide range of RF source power (0.5–3.0 kW), magnetic field strength (30–300 G), and pressures (0.5–50 mT), thereby expanding the processing window.

With the embodiment of FIG. 9, the processing chamber 200 has a side wall 215 having a workpiece insertin 250a located at the bottom of the side wall 215. The workpiece may be inserted through slit opening 245, through the workpiece insertion opening 250a, and onto the pedestal 230. A slit valve capable of accommodating ingress and egress of a silicon wafer may be used to seal slit opening 245 located in the exterior of the processing chamber 200.

The processing chamber 200 may also have an opening 260 in the side wall 215 to allow a vacuum to be created in the processing chamber 200. A vacuum pump 270 is coupled to the opening or vacuum pump opening 260 so that it creates the vacuum in the processing chamber. In the embodiment of FIG. 9, the vacuum pump opening 260 is annular shaped and located in the bottom of the side wall 215, where the side wall 215 and the bottom wall 225 would otherwise abut. The annular vacuum pump opening 260 may be formed narrower near the vacuum pump 270 and gradually increase as the opening approaches the opposite side of the processing chamber 200 (not shown) to equalize vacuum distribution around the processing chamber 200.

The vacuum pump 270 may also be coupled to a pumping annulus 280 that is located adjacent and below the vacuum pump opening 260. The pumping annulus 280 is in turn coupled to the vacuum pump opening 260 to assist in distributing vacuum to the vacuum pump opening 260. The pumping annulus 280 may be lined with a replaceable interior liner 282 so that the interior liner 282 may be replaced if contaminants deposit on the interior liner 282, or if the interior liner 282 becomes degraded as a result of being exposed to process gases or plasma.

In the embodiment of FIG. 9, the annular vacuum pump opening 260 also functions in part as the workpiece insertion opening 250a. Therefore, in this embodiment the workpiece insertion opening 250a in the side wall 215 of the processing chamber 200 also serves to evacuate gas from the processing chamber 200 as discussed above. Furthermore, the present invention may also be adapted to provide a workpiece insertion opening 250b in the opposite side of the reactor 10. In such a case, the workpiece 205 may be inserted through vacuum chamber 265, through the vacuum pump opening 260 that includes the workpiece insertion opening 250b, and onto the pedestal 230.

According to the present invention, the embodiment of FIG. 9 has annular multipole magnets 210f&g disposed above and below the annular vacuum pump opening to inhibit plasma from entering the vacuum pump opening 260 or the workplece insertion opening 250a and degrading reactor components. The multipole magnet structure of the present invention may be continued above the vacuum pump opening 260 so that the multipole magnets inhibit degradation of the processing chamber side wall 215.

In such a configuration, the multipole magnets 210a–g are located around the periphery of the processing chamber 200 to generate a magnetic field near the side wall 215 of the processing chamber 200 to create a magnetic bucket 220. With the embodiment of FIG. 9, each of the magnets 210a–g are disposed longitudinally around an axis perpendicular to the plane of the workpiece 205 to form the magnetic bucket 220. In the embodiment of FIG. 9, the multipole magnets 210a–g are aligned so that alternating magnets have opposite poles facing the interior of the chamber to create cusps 212b–f in the magnetic field. Each of the cusps is disposed longitudinally around an axis perpendicular to the plane of the workpiece 205 and may be circumferentially disposed with respect the central axis and located near the periphery of the chamber 200 as shown in FIG. 9.

The magnetic bucket 220 of the present invention extends along the entire side wall 215 and below. So, not only does the magnetic bucket 220 of the present invention contain the plasma near the center of the processing chamber 200 to increase plasma density and uniformity over the workpiece 205 to improve processing, it also contains the plasma away from the entire processing chamber side wall 215.

In addition, the lower portion of the magnetic bucket 220, formed by magnets 210f and 210g, inhibits the plasma from advancing into the vacuum pump opening 260 and into the workpiece insertion opening 250a. This keeps plasma from degrading the vacuum pump opening 260, the vacuum chamber 265, the pumping annulus 280, and the vacuum pump 270. It also keeps plasma from degrading the workpiece insertion opening 250a, the slit opening 245, and associated slit opening closure and sealing mechanisms (not shown).

The magnets 210a–g are preferably located so that they are not exposed to the interior of the processing chamber 200. The magnets 210a–e, therefore, are typically located outside the processing chamber 200, while the magnet 210f is located within the processing chamber side wall 215 and the magnet 210g is located below the bottom wall 225 of the processing chamber. The magnet 210g is also located below the magnet 210f so as to create a magnetic field 214 across the vacuum opening 260 and across the workpiece insertion opening 250a.

The magnets 210a–g are selected so that the magnetic field generated by the magnets 210a–g does not interfere with workpiece processing. For example, the magnets 210f and 210g must be selected so that the field generated by them does not extend over the workpiece 205 and detrimentally affect processing. Typically, the magnets 210f and 210g are capable of generating about 200 Gauss. The magnets 210a–g may be selected so that they are all of similar strength, or they may have greater strength in selected locations. For example, the magnets farther from the workpiece may be selected to have greater strength. Furthermore, the magnets need not be oriented or configured as shown in FIG. 9 but may have other configurations as discussed further below.

Figure 5:
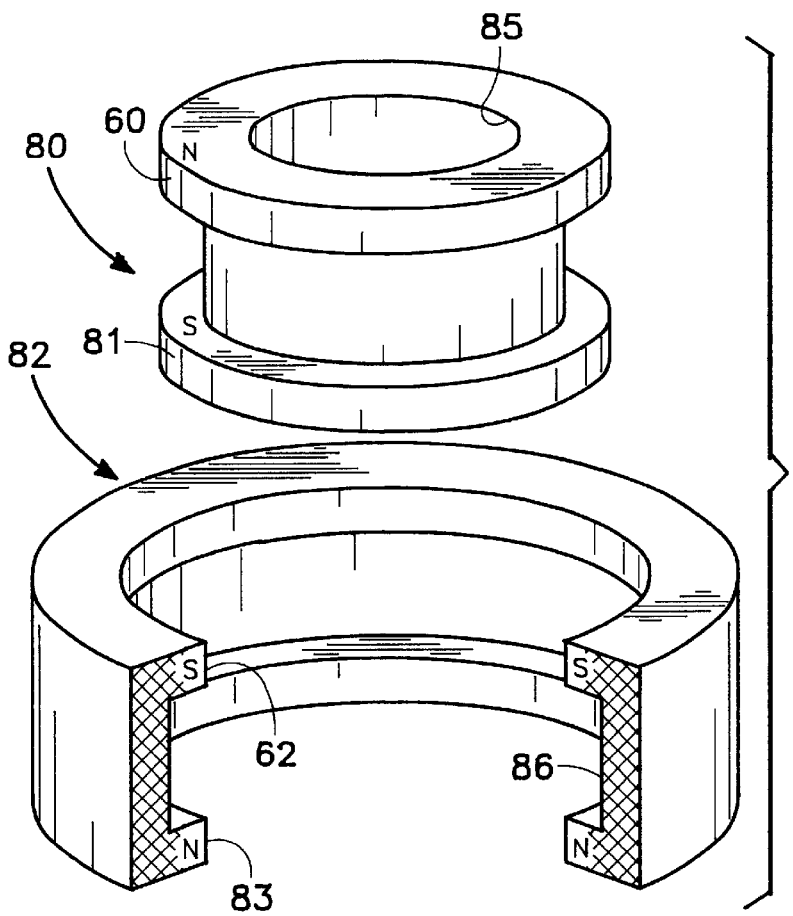
FIG. 5 is a perspective view of a pair of opposing ring magnets juxtaposed across the pedestal-to-side wall gap.

Additionally, closed magnetic circuit magnets as depicted in FIGS. 4B, 5, and 6 may be used in this embodiment. For example, a pair of opposing annular horseshoe magnets may be provided facing each other at 210f and 210g. Additionally, or alternatively, a single annular horseshoe magnet may be used to replace two adjacent annular magnets, such as 210a and 210b.

The present invention may provide the processing chamber with a controlled anode surface. The materials, size, and temperature of the anode surface are selected so that bias power application may be maximized without causing damage to the workpiece. Toward this end, the size of the anode surface is selected so that the bias voltage can be maximized without otherwise causing damage to the workpiece do to uneven charge build-up. Preferably, the anode to cathode surface area ratio is greater than or equal to about 3:1. As such, the selected anode surface is preferably electrically insulated from the rest of the processing chamber surfaces, such as the side wall, which may be at a floating potential. Furthermore, the temperature of the anode surface may be controlled to prevent build-up on the anode surface. Such build-up may reduce the bias voltage and retard, or degrade processing. The anode surface may be formed of silicon, silicon carbide, boron carbide, or the like so that it does not contaminate processing. It is possible to form the surface of the anode of aluminum oxide, such as by forming the anode of anodized aluminum, or it may be formed of ceramic material.

The controlled anode surface of the present invention is typically formed as a member 300 having a wall exposed to the interior of the processing chamber 200. The member 300 having a wall exposed to the interior of the processing chamber, referred to hereinafter as inner wall member 300, may be constructed so that it both protects the top wall or ceiling 235 of the processing chamber 200 from the high density plasma entering from the plasma chamber 105 and so that it provides an improved counterelectrode for the RF bias 240 which is applied to pedestal 230.

To protect the ceiling 235 of the processing chamber 200, the inner wall member 300 has an annular disk shape and is secured within the processing chamber 200 so that plasma is unable to flow between the inner wall member 300 and the ceiling 235 and degrade the ceiling 235. The inner edge of the annular inner wall member 300 may taper away from the plasma source chamber 105 to allow plasma to more uniformly flow into the processing chamber 200. The inner wall member 300 is formed of appropriate material and thickness so that it is capable of protecting the ceiling 235 even after multiple process runs. The inner wall member 300 is expected to have a typical thickness of greater than about 5 millimeters.

Although not shown, it is also possible to recess the inner wall member in the ceiling 235, or to have the inner wall member be part of, or the entire ceiling. In such a case, the inner wall member would be electrically insulated from the plasma chamber and from the side wall 215 so as to provide control of the bias circuit as discussed above. Preferably the inner wall member 300 should be secured to the processing chamber 200 so that it can be easily replaced.

The voltage potential of the inner wall member 300 may be controlled so that it is varied, or fixed. Presently, it is preferred to fix the voltage potential of the inner wall member 300 at ground, although in some embodiments the inner wall member may have an applied AC voltage, such as an RF bias, or an applied non-ground DC voltage. The processing chamber side wall 215, the ceiling 235, and the portion of the bottom wall 225 not defined by the pedestal 230 may then be insulated from ground. It is presently preferred to form the inner wall 300 so that it has at least about 3:1 grounded surface-to-workpiece surface ratio. The at least 3:1 ratio allows processing rates to be increased while not causing charge damage to the workpiece. As such, the inner wall member 300 may be formed so that only a portion of inner wall member 300 is grounded, or the inner wall member 300 may have an additional side wall depending from the periphery of an annular portion so as to increase its surface area with respect to the workpiece surface, as will be discussed below.

To prevent deposits from accumulating on the grounded inner wall member 300 and changing the impedance of the bias circuit, the temperature of the inner wall member 300 is regulated so that deposits capable of changing the impedance of the bias circuit do not accumulate on the inner wall member 300. For example, during oxide etch, polymers formed from $C_4F_8$ typically condense on reactor surfaces at about 200 degrees to 220 degrees Centigrade. The temperature of the inner wall member 300, therefore, is maintained at about 250 degrees Centigrade to prevent polymer build-up on the inner wall member 300 during oxide etch.

Figure 10:
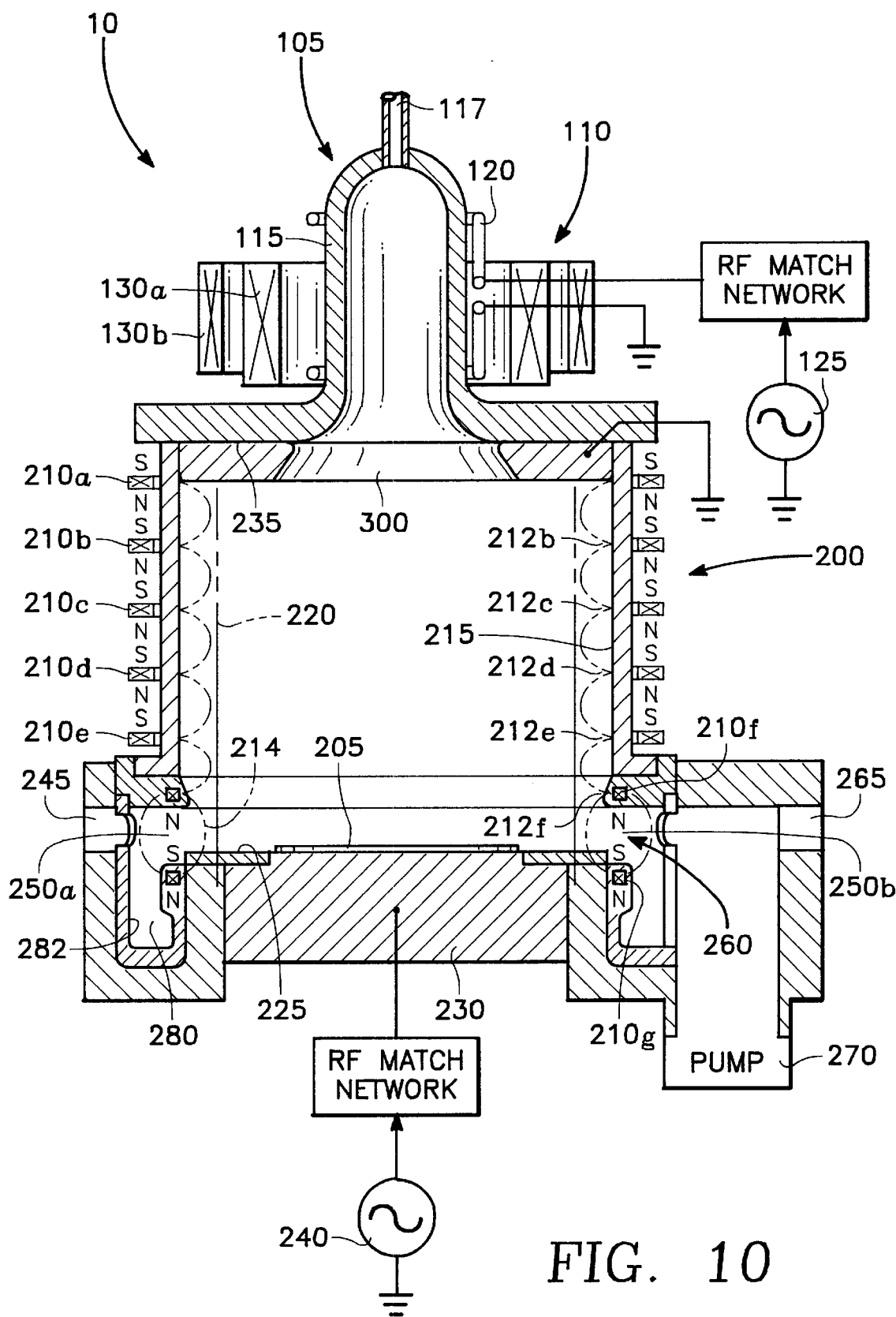
FIG. 10 is a cross-sectional view of the Magnetically Enhanced Inductively Coupled plasma reactor of FIG. 9 with an alternative magnetic pole layout.

FIG. 10 shows an alternative embodiment of the plasma reactor of the present invention. The plasma reactor of FIG. 10 depicts the reactor of FIG. 9 having an alternative structure for forming the magnetic bucket 220. In FIG. 10, the multipole magnets 210a–g, used to generate the magnetic bucket 220 are disposed around central axis of the processing chamber 200. In the embodiment of FIG. 10, the multipole magnets 210a–g are oriented so that opposite poles of each of the magnets 210a–g face parallel to an axis perpendicular to the plane of the workpiece. Adjacent poles of successive magnets 210a–g have opposite polarity so as to form cusps 212b–f disposed longitudinally around an axis perpendicular to the plane of the workpiece 205. The cusps 212b–f may be disposed circumferentially around the central axis and located near, or at the periphery of the chamber 200 as shown in FIG. 10.

Figure 11:
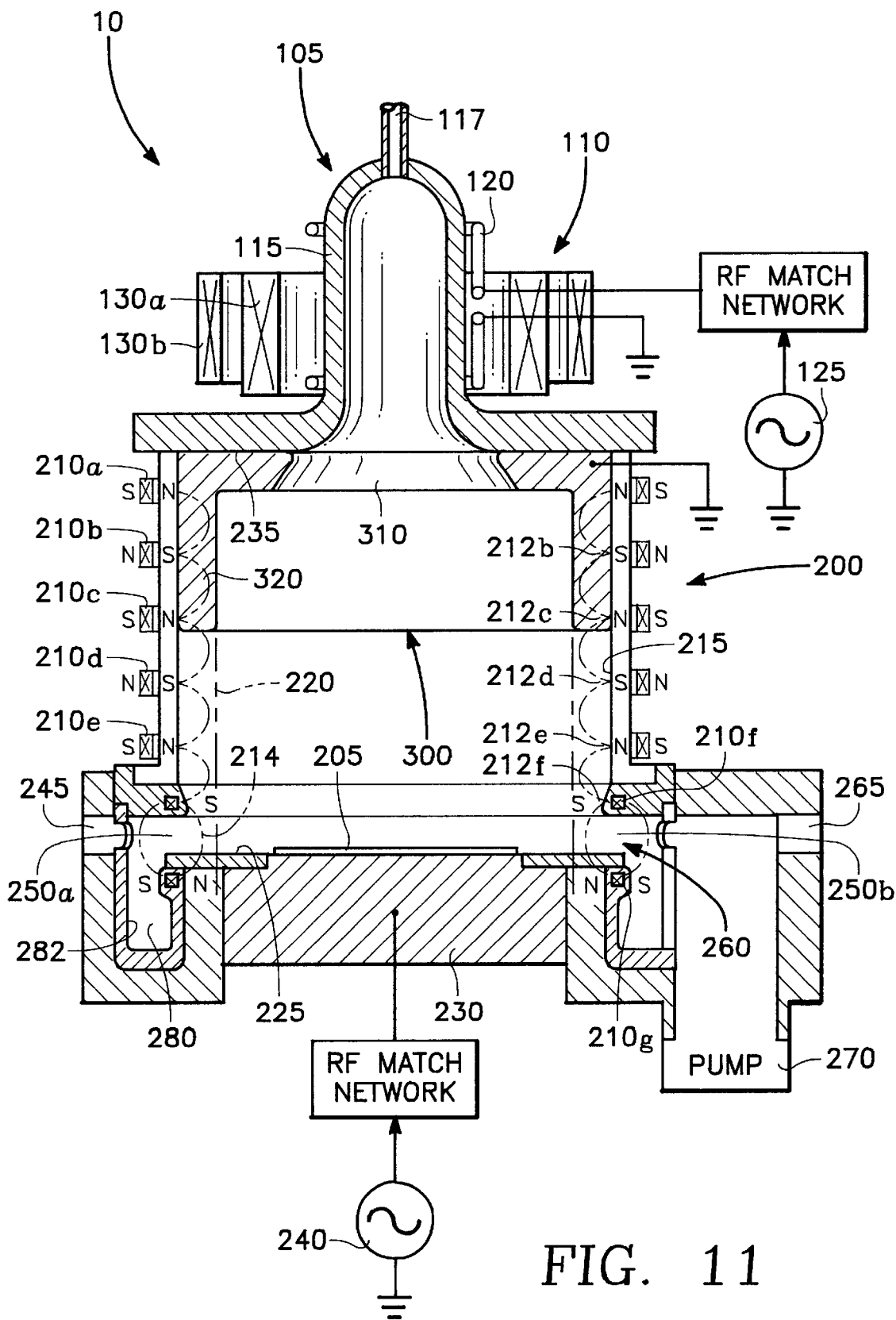
FIG. 11 is a cross-sectional view of the Magnetically Enhanced Inductively Coupled plasma reactor of FIG. 9 with an alternative structure for the inner wall member.

FIG. 11 shows another embodiment of the plasma reactor of the present invention. In the embodiment of FIG. 11, the inner wall member 300 has an annular portion 310 with a cylindrical side wall portion 320 depending from the annular portion 310. The cylindrical portion 320 may be formed integrally with the annular portion and grounded to provide additional surface area for use in controlling ion energy at the workpiece 205. Furthermore, the cylindrical portion 320 serves to expand the electric field profile created within the processing chamber 200 by the bias power. This allows better control the plasma ions adjacent the lower portion of side wall 215.

As discussed above inner wall member 300 is typically grounded with the side wall 215, the ceiling 235, and the portion of the bottom wall 225 not formed by the pedestal being insulated from ground. As such, if the inner wall member 300 is coupled to ground and the side wall 215 and the ceiling 235 of the processing chamber 200 are electrically conductive, the inner wall member 300 must be secured within the processing chamber so that it is insulated from the side wall 215 and the ceiling 235.

The inner wall member 235 may be formed so that only a portion of the wall is coupled to ground while other portions are insulated from ground. For example, annular portion 310, or part of annular portion 310, may be insulated from ground while cylindrical portion 320 is grounded. By forming the inner wall member 300 of electrically insulated portions, greater control of bias power application may be achieved.

It is possible in some embodiments to form the inner wall member of a material that will resist surface micro arcing caused by conductive by-products that may deposit on the surface of the inner wall member 300. A non-polarized material, such as silicon carbide or boron carbide, may be selected to form the surface of, or the entire inner wall member 300 so as to reduce surface micro arcing caused by conductive by-products deposited on the surface of the inner wall member 300.

Figure 12:
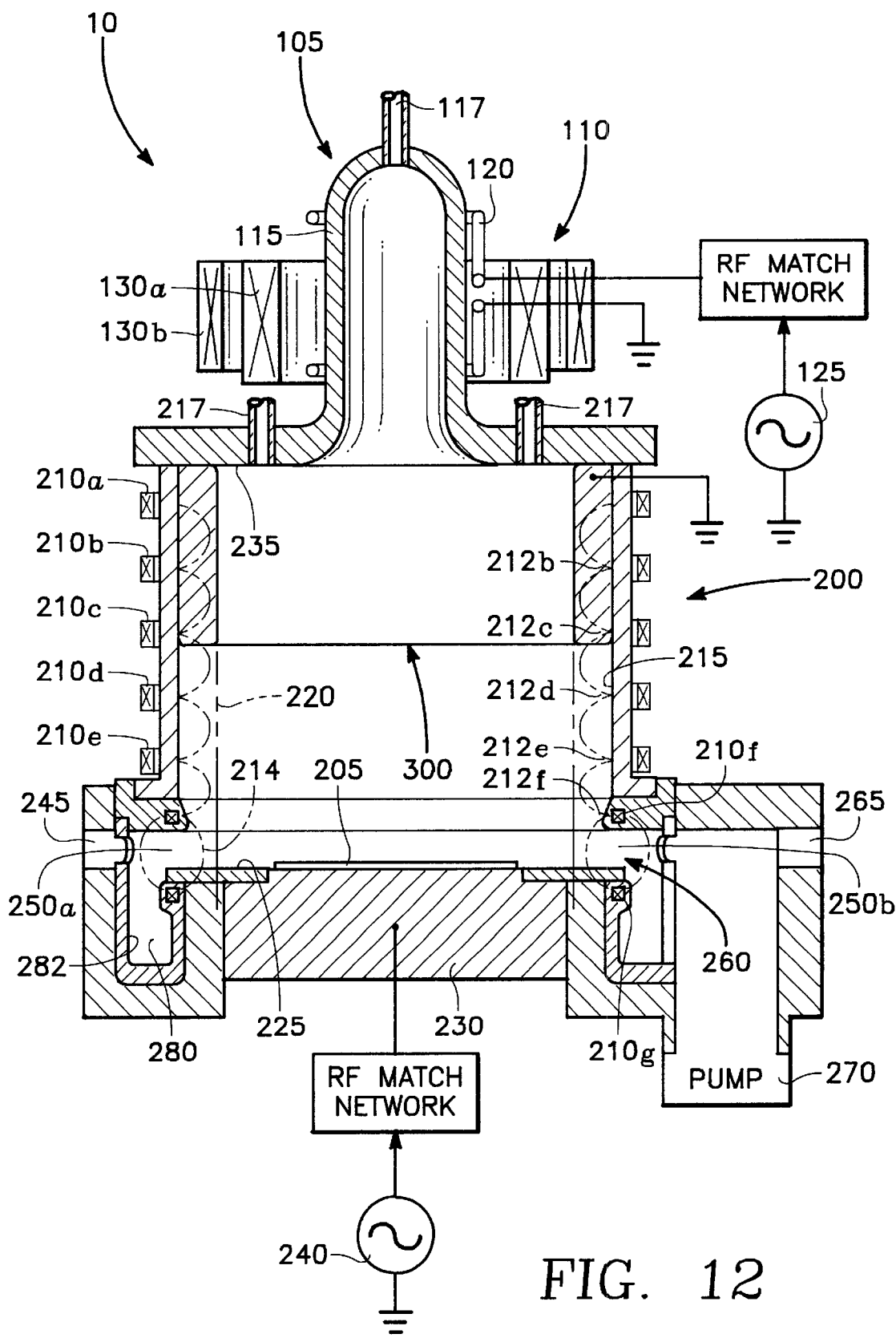
FIG. 12 is a cross-sectional view of the Magnetically Enhanced Inductively Coupled plasma reactor of FIG. 9 having process gas inlets in the processing chamber, an alternative magnetic field generator, and an alternative inner wall member structure.

Turning to FIG. 12, the magnetic bucket may be formed by passing a current through conductors 210a–g to generate a magnetic field near side wall 215 of the processing chamber 200 to create the magnetic bucket 220. As such, conductors 210a–g or multipole magnets, as discussed above, may be used as a magnetic field generator. Furthermore, it may be desirable to have the magnetic field generator formed using both conductors 210a–e, and multipole magnets 210f and 210g, to allow the profile of the magnetic bucket to be fixed near the workpiece and adjustable near the plasma source chamber 105.

In the embodiment of FIG. 12, the inner wall member 300 is cylindrical and secured within the processing chamber 200 near the ceiling 235.

It is possible in some embodiments to pass gas inlets 217 through the ceiling, as shown in FIG. 12, and/or through sidewalls of the processing chamber 235 in addition to, or instead of, the plasma chamber gas inlet 117. It also is possible in some embodiments to supply gas through an inlet/inlets located in the bottom wall 225 of the processing chamber. In addition, although shown as tube like inlets, it is possible to use any type inlet, such as for example annular inlets, which may be located in the bottom, side, or top walls. Furthermore, a singular type, or a mixture of types of process and/or inert gases may be supplied through individual gas inlets.

Figure 2:
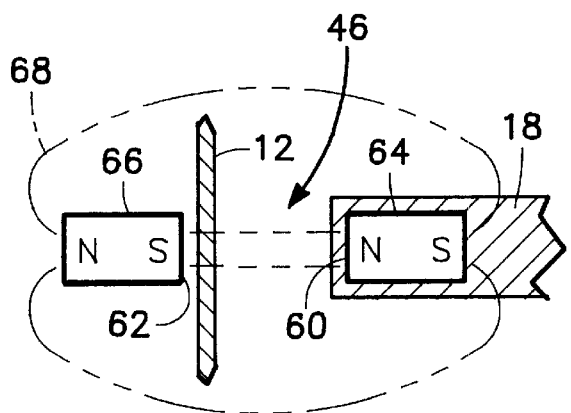
FIG. 2 is an enlarged view of the magnetic confinement apparatus near the pedestal-to-side wall gap.
Figure 3:
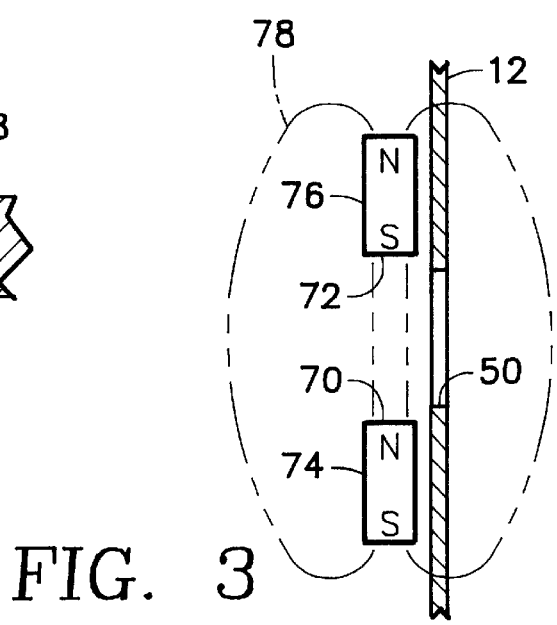
FIG. 3 is an enlarged view of the magnetic confinement apparatus near the wafer slit valve.
Figure 13:
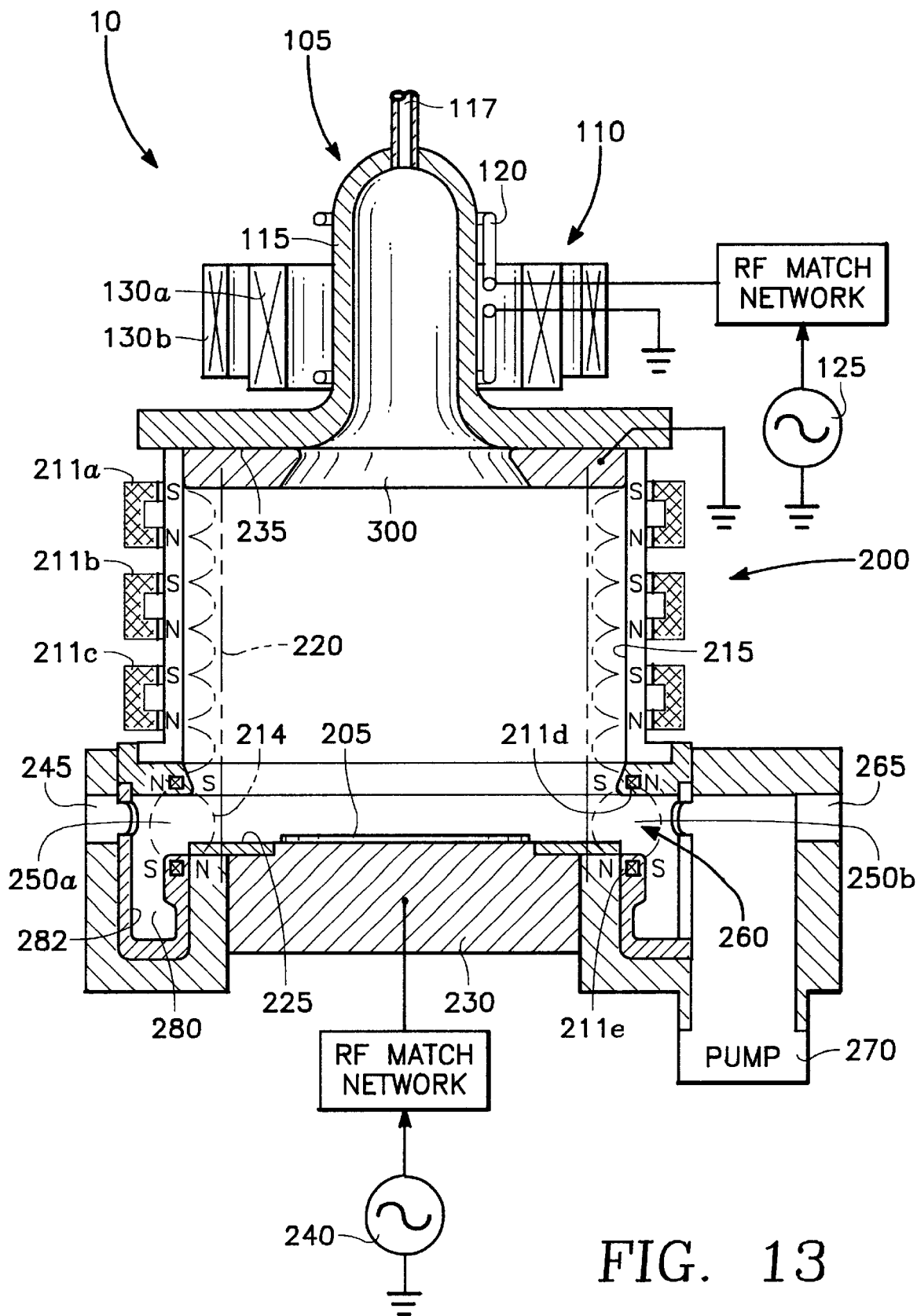
FIG. 13 is a cross-sectional view of the Magnetically Enhanced Inductively Coupled plasma reactor of FIG. 9 employing both open and closed circuit magnets.

FIG. 13 provides yet another possible embodiment of the present invention. With the embodiment of FIG. 13, horseshoe magnets 211a–c may be used near the upper portion of the processing chamber 200 to protect the chamber side wall, while conventional magnets as shown in FIGS. 2 & 3 may be employed at 211d&e to inhibit plasma flow into the vacuum pump opening 260 and the workpiece insertion openings 250a&b located in the sidewall 215. The magnets 211a–e form the magnetic bucket 220 which extends along the side wall 215 of the processing chamber 200 and across the workpiece insertion opening 250a and the vacuum pump opening 260.

Figure 14:
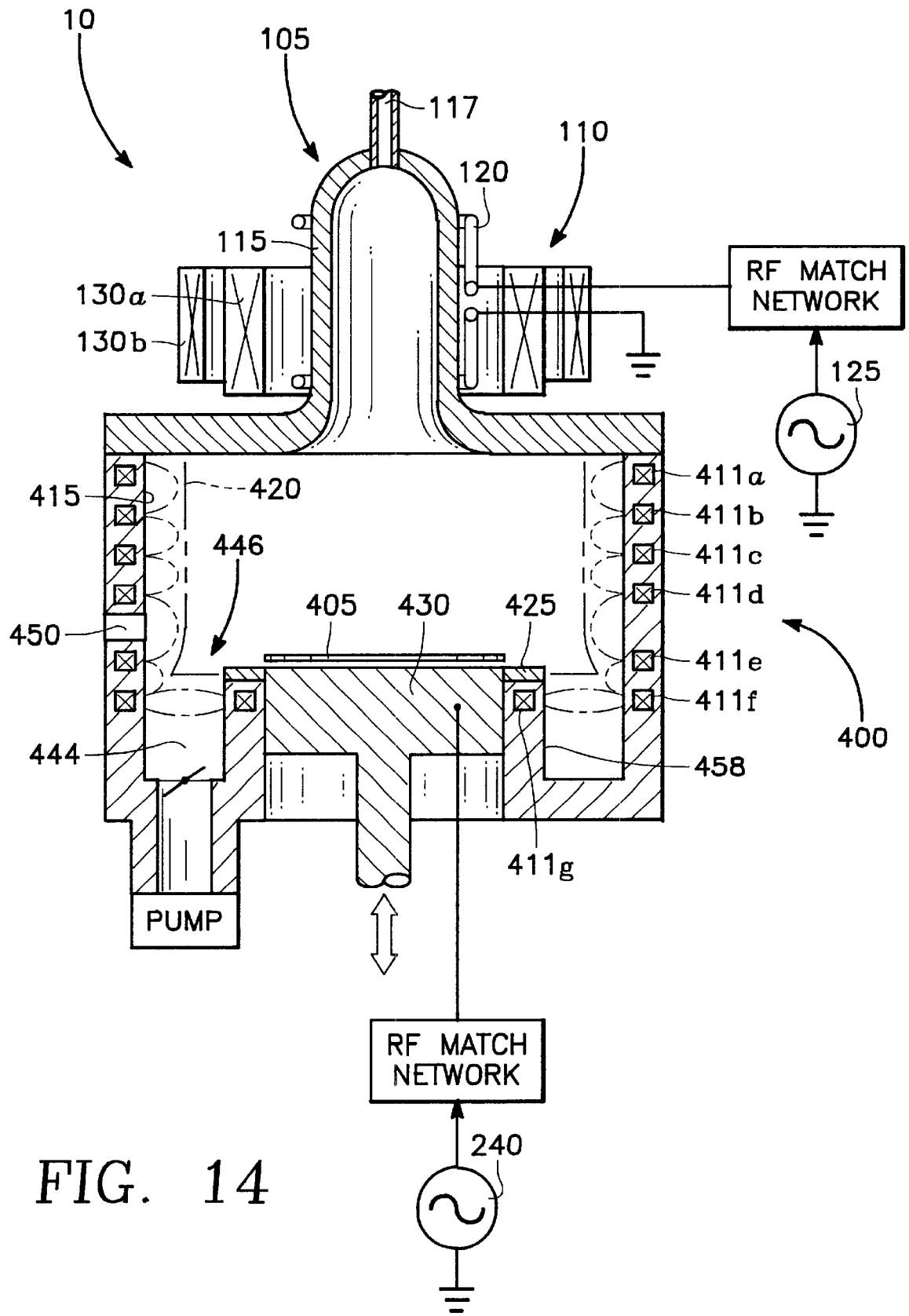
FIG. 14 is a cross-sectional view of another embodiment of the Magnetically Enhanced Inductively Coupled reactor of the present invention employing horseshoe magnets.

Turning to FIG. 14, in a further embodiment of the present invention, the helicon wave plasma source 105 supplies plasma to a processing chamber 400. Similar to FIG. 1, the processing chamber of FIG. 14 has the workpiece insertion opening 450 located in the side wall 415 of the processing chamber 400 and the vacuum pump opening 460 located in the bottom wall 425 of the processing chamber 400. The magnets 411a–g form a magnetic bucket 420. The magnets 411f&g inhibit plasma from flowing into the vacuum pump opening 460, while magnets 411e&f inhibit plasma from flowing into the workpiece insertion opening 450. Magnets 411a–f contain the plasma toward the center of the processing chamber, while 411a–g protect the entire side wall 415 and the vacuum pump opening 446 in the bottom wall of processing chamber 400 so as to allow the magnetic bucket 420 to inhibit plasma from flowing into the vacuum pump and workpiece insertion openings 446 & 450 even when pedestal 430 is its lowermost position in the processing chamber 415.

In the embodiment of FIG. 14, it is possible to adapt the pedestal 430. to allow it to be raised. In such a case, the magnet 411g may remain in the fixed wall 458 of the pumping annulus 444. The magnets 411f&g, therefore, inhibit plasma from flowing into the vacuum pump opening 446 when the pedestal is in a raised position.

Figure 15:
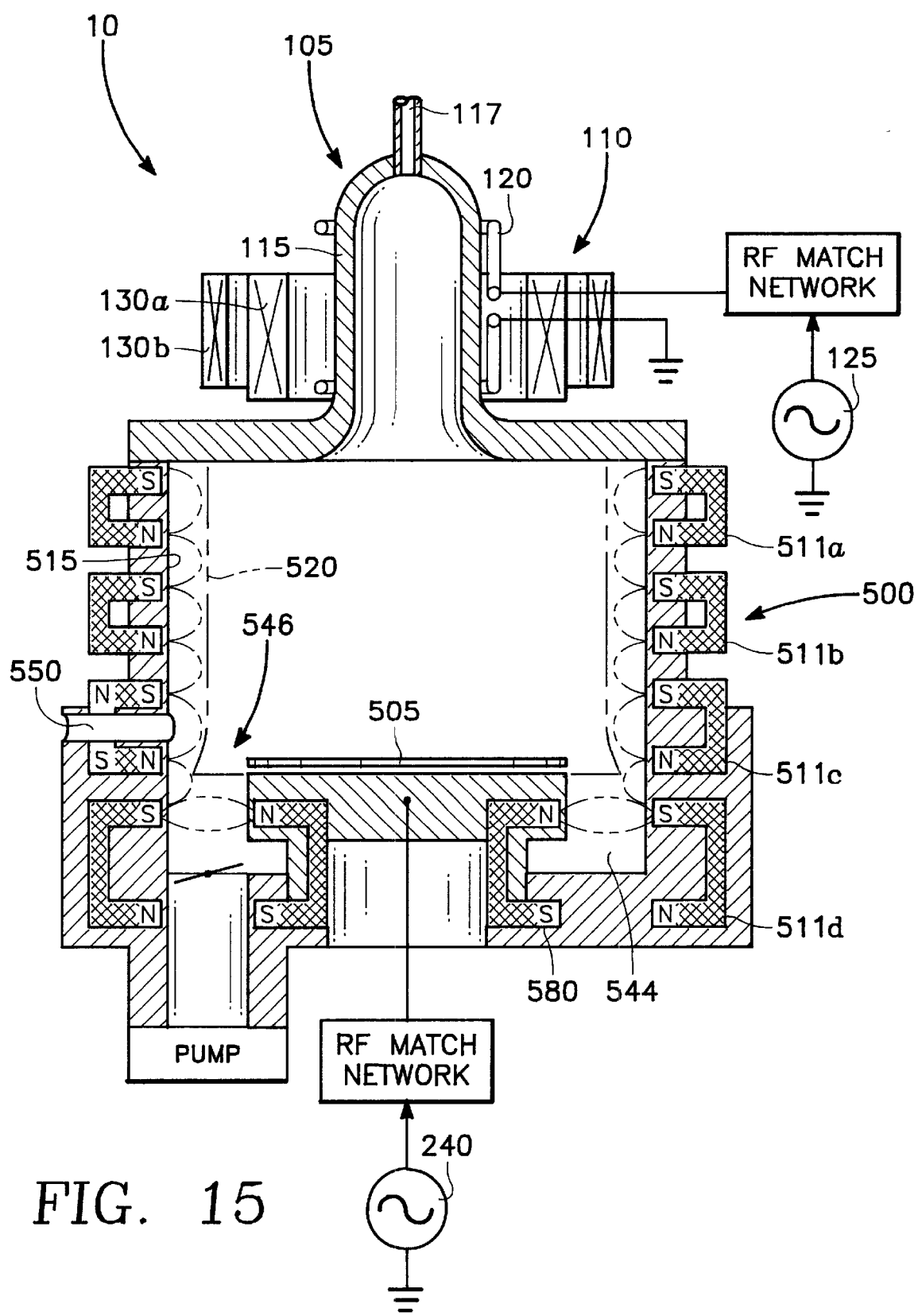
FIG. 15 is a cross-sectional view of another embodiment of the Magnetically Enhanced Inductively Coupled reactor employing embedded magnets.

Turning to FIG. 15, horseshoe magnets 511a–d are employed around the processing chamber 500. The lower horseshoe magnets 580 and 511d are located as depicted in FIGS. 4A & 4B so as to inhibit plasma from flowing into the vacuum pump opening 546. Horseshoe magnet 511c is provided with a slit so that a workpiece may be inserted into the processing chamber through workpiece insertion opening 550a. Magnets 511a–d and 580 form the magnetic bucket 520.

Figure 16:
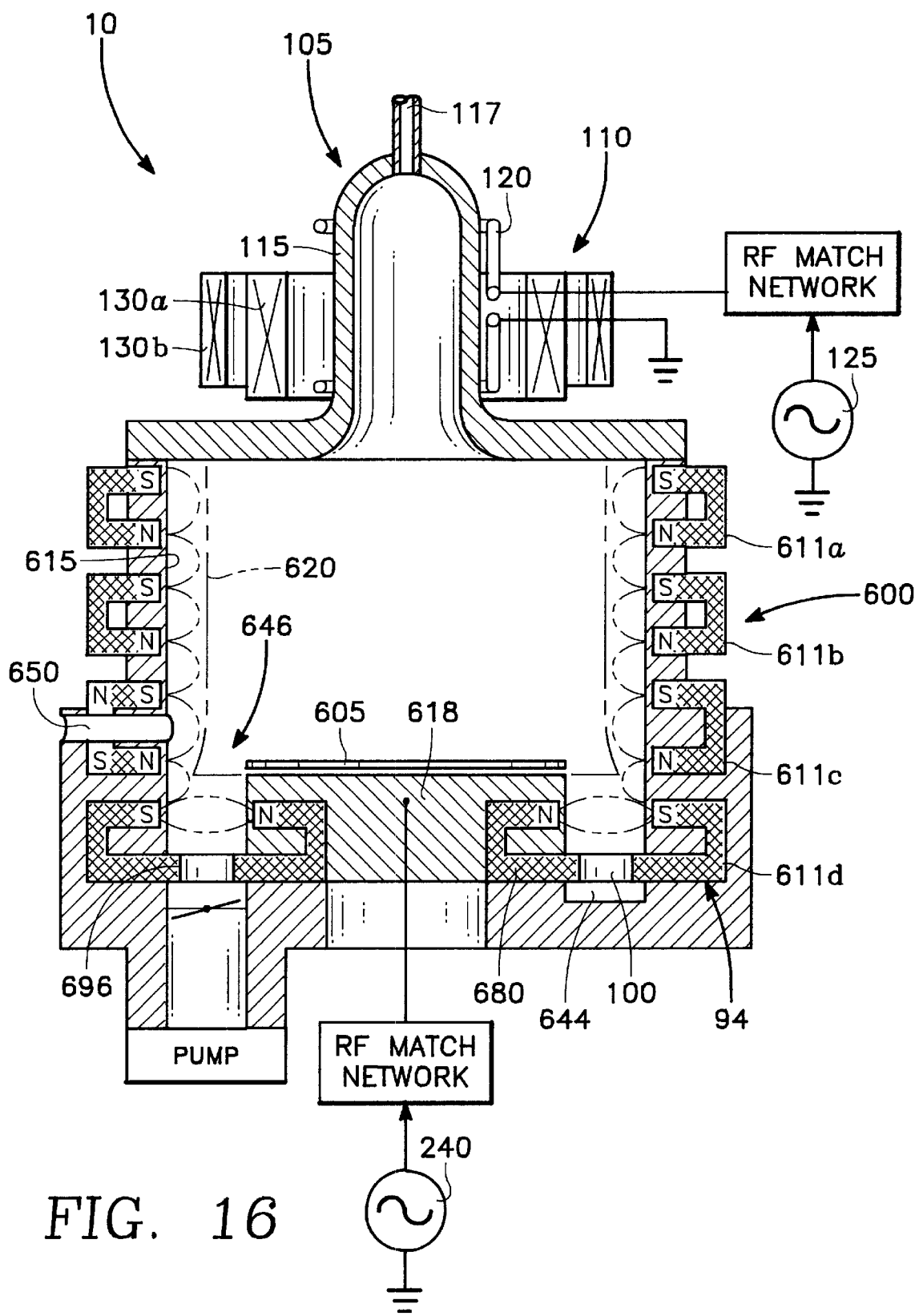
FIG. 16 is a cross-sectional view of another embodiment of the Magnetically Enhanced Inductively Coupled reactor of the present invention employing horseshoe magnets.

FIG. 16 depicts yet another possible embodiment of the present invention. The processing chamber 600 of FIG. 16 is provided with horseshoe magnets 611a–d located around the processing chamber 600. The magnet 611d is adjacent inner horseshoe magnet 680 and has a core 696 having holes 100 as shown in FIGS. 7&8. The core 696 extends across the pumping annulus 644 and can be coated with a protective coating. The magnets 611a–d and 680 provide the magnetic bucket 620.

Although not shown in FIGS. 13–16, the controlled anode member may be provided in the embodiments of FIG. 13–16 as discussed above. Furthermore, another gas inlet, or multiple gas inlets may be employed in addition to, or instead of, gas inlet 117 as discussed above.

The embodiments of FIGS. 9–16 may also employ species density control as disclosed in U.S. patent application Ser. No. 09/119,417, by Yin, et al., filed on Jul. 20, 1998, entitled PLASMA ASSISTED PROCESSING CHAMBER WITH SEPARATE CONTROL OF SPECIES DENSITY, issued as U.S. Pat. No. 6,352,049, herein incorporated by reference in its entirety. As such, the embodiments of FIGS. 9–16 may utilize a filter (not shown) interposed between the plasma chamber and the processing chamber.

The embodiments of FIGS. 9–16 may also employ plasma chamber temperature control as disclosed in U.S. patent application Ser. No. 09/263,642, by Yin, et al., filed Mar. 5, 1999, now U.S. Pat. No. 6,189,484, entitled PLASMA REACTOR HAVING A HELICON WAVE HIGH DENSITY PLASMA SOURCE, herein incorporated by reference in its entirety. In the preferred embodiments, it is possible to control the temperature of any of the reactor components as is known in the art. For example, it is possible to control the temperature of the processing chamber walls and components in addition to the source chamber walls and components.

While the only the presently preferred embodiments of the invention are described above, other embodiments may be formed that fall within the scope of the present invention. The true scope and breadth of the invention, therefore, is limited only by what is claimed.

What we claim is:

1. A plasma reactor comprising:
   a) a plasma source chamber capable of generating a plasma;
   b) a processing chamber adapted to hold a workpiece therein, the processing chamber being coupled to the plasma source chamber so as to allow plasma generated in the plasma chamber to flow to the processing chamber;
   c) a plurality of magnets, each of the plurality of magnets being disposed longitudinally around an axis perpendicular to a processing surface of the workpiece, the plurality of magnets forming a magnetic bucket; and
   d) the processing chamber comprising a wall having a workpiece insertion opening, the workpiece insertion opening being within the magnetic bucket.

2. The plasma reactor of claim 1 wherein the plurality of magnets are disposed so that opposite poles of each magnet form a line parallel to the axis perpendicular to the processing surface of the workpiece.

3. The plasma reactor of claim 1 wherein the plurality of magnets are disposed so that opposite poles of each magnet face perpendicular to the axis perpendicular to the processing surface of the workpiece.

4. The plasma reactor of claim 3 wherein the wall of the processing chamber further comprises a vacuum pump opening, and wherein the vacuum pump opening is within the magnetic bucket.

5. The plasma reactor of claim 1 wherein the wall of the processing chamber further comprises a vacuum pump opening, and wherein the vacuum pump opening is within the magnetic bucket.

6. The plasma reactor of claim 5 wherein the processing chamber comprises a side wall, and wherein the workpiece insertion opening and the vacuum pump opening are located in the side wall.

7. The plasma reactor of claim 5 wherein the processing chamber comprises a side wall and a bottom wall, and wherein the workpiece insertion opening is located in the side wall and the vacuum pump opening is located in the bottom wall.

8. The plasma reactor of claim 5 wherein the plurality of magnets are disposed so that opposite poles of each magnet form a line parallel with the axis perpendicular to the processing surface of the workpiece.

9. The plasma reactor of claim 5 wherein the plurality of magnets are disposed so that opposite poles of each magnet face perpendicular to the axis perpendicular to the processing surface of the workpiece.

10. The plasma reactor of claim 1 wherein the workpiece insertion opening is positioned between two adjacent magnets, and wherein the two adjacent magnets are of sufficient magnetic strength to inhibit plasma from advancing into the workpiece insertion opening.

11. The plasma reactor of claim 10 wherein the wall of the processing chamber further comprises a vacuum pump opening, and wherein the vacuum pump opening is positioned between two adjacent magnets, and wherein the two adjacent magnets are of sufficient magnetic strength to inhibit plasma from advancing into the vacuum pump opening.

12. The plasma reactor of claim 1 wherein the processing chamber comprises a bottom wall, and wherein the magnetic bucket extends below the bottom wall of the processing chamber.

13. The plasma reactor of claim 12 wherein the processing chamber comprises a side wall, and wherein the workpiece insertion opening and the vacuum pump opening are located in the side wall.

14. The plasma reactor of claim 12 wherein the processing chamber comprises a side wall, and wherein the workpiece insertion opening is located in the side wall and the vacuum pump opening is located in the bottom wall.

15. The plasma reactor of claim 12 wherein the plurality of magnets are disposed so that opposite poles of each magnet form a line parallel with the axis perpendicular to the processing surface of the workpiece.

16. The plasma reactor of claim 12 wherein the plurality of magnets are disposed so that opposite poles of each magnet face perpendicular to the axis perpendicular to the processing surface of the workpiece.

17. The plasma reactor of claim 1 further comprising an inner wall member secured to a wall of the processing chamber.

18. The plasma reactor of claim 17 wherein the inner wall member comprises an annular disk.

19. The plasma reactor of claim 17 wherein the inner wall member comprises a cylindrical wall.

20. The plasma reactor of claim 17 wherein the inner wall member has a voltage applied.

21. The plasma reactor of claim 17 wherein the inner wall member is grounded.

22. The plasma reactor of claim 21 wherein the inner wall member is heated to prevent deposition of polymer material on the inner wall.

23. The plasma reactor of claim 21 wherein the inner wall member is comprised of silicon carbide.

24. The plasma reactor of claim 21 wherein the inner wall member is comprised of boron carbide.

25. The plasma reactor of claim 18 wherein at least a portion of the inner wall member has a floating potential.

26. The plasma reactor of claim 25 wherein the inner wall member is comprised of a non-polarized type material so as to prevent surface micro-arcing of the conductive deposits on the inner wall member.

27. The plasma reactor of claim 26 wherein the inner wall member is comprised of silicon carbide.

28. The plasma reactor of claim 26 wherein the inner wall member is comprised of boron carbide.

29. The plasma reactor of claim 25 wherein the inner wall is heated to prevent deposition of conductive material on the inner wall member.

30. The plasma reactor of claim 1 further comprising a workpiece pedestal capable of being raised into the processing chamber, and wherein at least one of the plurality of magnets is located below the workpiece pedestal so that the magnetic bucket extends below the workpiece pedestal without raising the workpiece pedestal into the processing chamber.

31. The plasma reactor of claim 1 wherein the plurality of magnets are annular magnets located circumferentially around a central axis of the processing chamber.

32. The plasma reactor of claim 1 wherein the plasma source chamber is capable of generating a helicon wave.

33. A method for processing a workpiece comprising:
   a) generating a plasma in a plasma chamber;
   b) delivering the plasma to a processing chamber having a workpiece therein, said processing chamber having a wafer insertion opening;
   c) forming a magnetic bucket within the processing chamber having a plurality of cusps, each of the cusps being disposed longitudinally around an axis perpendicular to a processing surface of the workpiece, using a magnetic field generator located outside the processing chamber; and
   d) confining the plasma within the processing chamber so that the plasma is inhibited from advancing into a wafer insertion opening.

34. The method for processing a workpiece of claim 33 wherein forming the magnetic bucket utilizes a plurality of magnets so that opposite poles of each magnet form a line parallel with the axis perpendicular to the processing surface of the workpiece.

35. The method for processing a workpiece of claim 33 wherein forming the magnetic bucket utilizes a plurality of magnets so that opposite poles of each magnet face perpendicular to the axis perpendicular to the processing surface of the workpiece.

36. The method for processing a workpiece of claim 33 further comprising confining the plasma within the processing chamber so that the plasma is inhibited from advancing into a vacuum pump opening.

37. The method for processing a workpiece of claim 36 wherein forming the magnetic bucket utilizes a plurality of magnets so that opposite poles of each of the plurality of magnets form a line parallel with the axis perpendicular to the processing surface of the workpiece.

38. The method for processing a workpiece of claim 36 wherein forming the magnetic bucket utilizes a plurality of magnets so that opposite poles of each of the plurality of magnets face perpendicular to the axis perpendicular to the processing surface of the workpiece.

39. The method for processing a workpiece of claim 33 further comprising securing an inner wall member to a wall of the processing chamber.

40. The method for processing a workpiece of claim 39 further comprising applying a voltage to the inner wall member.

41. The method for processing a workpiece of claim 39 wherein the inner wall member is grounded.

42. The method for processing a workpiece of claim 41 further comprising heating the inner wall.

43. The method for processing a workpiece of claim 41 wherein securing the inner wall member to a wall of the processing chamber further comprises selecting the inner wall member comprised of silicon carbide.

44. The method for processing a workpiece of claim 41 wherein securing the inner wall member to a wall of the processing chamber further comprises selecting the inner wall member comprised of boron carbide.

45. The method for processing a workpiece of claim 39 wherein securing the inner wall member to a wall of the processing chamber further comprises selecting the inner wall member comprised of a non-polarized-type material so as to prevent surface micro-arcing of the conductive deposits on the inner wall member.

46. The method for processing a workpiece of claim 45 wherein securing the inner wall member to a wall of the processing chamber further comprises selecting the inner wall member comprised of silicon carbide.

47. The method for processing a workpiece of claim 45 wherein securing the inner wall member to a wall of the processing chamber further comprises selecting the inner wall member comprised of boron carbide.

48. The method for processing a workpiece of claim 45 further comprising heating the inner wall.

49. The method for processing a workpiece of claim 33 wherein generating the plasma further comprises generating a helicon wave within the plasma chamber.

50. The method for processing a workpiece of claim 33 wherein the magnetic bucket is formed within the processing chamber so that the magnetic bucket extends below a workpiece pedestal without raising the workpiece pedestal into the processing chamber.

* * * * *